(12) United States Patent
Yasuhara et al.

(10) Patent No.: US 12,087,850 B2
(45) Date of Patent: Sep. 10, 2024

(54) SEMICONDUCTOR DEVICE AND SEMICONDUCTOR CIRCUIT

(71) Applicants: Kabushiki Kaisha Toshiba, Tokyo (JP); Toshiba Electronic Devices & Storage Corporation, Tokyo (JP)

(72) Inventors: Norio Yasuhara, Ishikawa (JP); Yoko Iwakaji, Tokyo (JP); Yusuke Kawaguchi, Ishikawa (JP); Daiki Yoshikawa, Ishikawa (JP); Kenichi Matsushita, Ishikawa (JP); Shoko Hanagata, Ishikawa (JP); Tomoko Matsudai, Tokyo (JP); Hiroko Itokazu, Kanagawa (JP); Keiko Kawamura, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 380 days.

(21) Appl. No.: 17/473,588

(22) Filed: Sep. 13, 2021

(65) Prior Publication Data
US 2022/0302288 A1     Sep. 22, 2022

(30) Foreign Application Priority Data
Mar. 19, 2021   (JP) .................................. 2021-046674

(51) Int. Cl.
*H01L 29/739*   (2006.01)
*H01L 29/40*    (2006.01)
(Continued)

(52) U.S. Cl.
CPC ........ *H01L 29/7397* (2013.01); *H01L 29/407* (2013.01); *H01L 29/41708* (2013.01);
(Continued)

(58) Field of Classification Search
CPC ............... H01L 29/7397; H01L 29/407; H01L 29/41708; H01L 29/42304;
(Continued)

(56) References Cited

U.S. PATENT DOCUMENTS 6,429,481 B1   8/2002   Mo et al.
8,614,483 B2   12/2013  Tanabe et al.
(Continued)

FOREIGN PATENT DOCUMENTS

EP      2953166 A1      12/2015
JP      2008-227514 A    9/2008
(Continued)

*Primary Examiner* — Tucker J Wright
(74) *Attorney, Agent, or Firm* — Knobbe Martens Olson & Bear LLP

(57) ABSTRACT

This semiconductor device includes: a semiconductor layer having a first face and a second face, the semiconductor layer including a first trench and a second trench in a first face side; a first gate electrode in the first trench; a first conductive layer in the first trench and between the first gate electrode and the second face, the first conductive layer being electrically separated from the first gate electrode; a second gate electrode in the second trench; a second conductive layer in the second trench and between the second gate electrode and the second face; a first electrode on a the first face side; a second electrode on a side of the second face; a first gate electrode pad being electrically connected to the first gate electrode; and a second gate electrode pad being electrically connected to the second gate electrode.

12 Claims, 19 Drawing Sheets

(51) Int. Cl.
   *H01L 29/417* (2006.01)
   *H01L 29/423* (2006.01)
   *H03K 17/567* (2006.01)

(52) U.S. Cl.
   CPC ..... *H01L 29/42304* (2013.01); *H03K 17/567* (2013.01); *H01L 29/42372* (2013.01)

(58) Field of Classification Search
   CPC ........... H01L 29/42372; H01L 29/1095; H01L 29/0696; H03K 17/567
   See application file for complete search history.

(56) References Cited

U.S. PATENT DOCUMENTS

| | | | |
|---|---|---|---|
| 8,890,252 | B2 | 11/2014 | Saikaku et al. |
| 10,276,681 | B2 | 4/2019 | Bina et al. |
| 10,573,732 | B2 | 2/2020 | Iwakaji et al. |
| 2010/0078707 | A1* | 4/2010 | Haeberlen ........... H01L 29/7803 438/270 |
| 2011/0215399 | A1 | 9/2011 | Mastuura et al. |
| 2014/0209972 | A1 | 7/2014 | Sumitomo et al. |
| 2015/0340480 | A1 | 11/2015 | Matsuura |
| 2018/0226487 | A1 | 8/2018 | Oota et al. |
| 2018/0277642 | A1 | 9/2018 | Laven et al. |
| 2019/0006495 | A1 | 1/2019 | Ogura et al. |
| 2019/0296134 | A1 | 9/2019 | Matsudai et al. |
| 2020/0083879 | A1 | 3/2020 | Tanaka et al. |
| 2020/0091323 | A1 | 3/2020 | Iwakaji et al. |
| 2020/0091326 | A1 | 3/2020 | Iwakaji et al. |
| 2020/0303525 | A1 | 9/2020 | Iwakaji et al. |
| 2021/0091193 | A1 | 3/2021 | Iwakaji et al. |

FOREIGN PATENT DOCUMENTS

| | | |
|---|---|---|
| JP | 2011-181809 A | 9/2011 |
| JP | 2011-199109 A | 10/2011 |
| JP | 4840370 B2 | 12/2011 |
| JP | 2012-049499 A | 3/2012 |
| JP | 2013-098415 A | 5/2013 |
| JP | 2013-251395 A | 12/2013 |
| JP | 5594276 B2 | 9/2014 |
| JP | 5768395 | 8/2015 |
| JP | 5831598 B2 | 12/2015 |
| JP | 2018-129513 A | 8/2018 |
| JP | 2019-12813 A | 1/2019 |
| JP | 6567581 B2 | 8/2019 |
| JP | 2019-169575 A | 10/2019 |
| JP | 2019-169597 A | 10/2019 |
| JP | 2020-047789 A | 3/2020 |
| JP | 2020-047790 A | 3/2020 |
| JP | 2020-155582 A | 9/2020 |
| JP | 2021-048337 A | 3/2021 |
| WO | 2018109794 A1 | 6/2018 |

\* cited by examiner

US 12,087,850 B2

SEMICONDUCTOR DEVICE AND SEMICONDUCTOR CIRCUIT

CROSS-REFERENCE TO RELATED APPLICATION

This application is based upon and claims the benefit of priority from Japanese Patent Application No. 2021-046674, filed on Mar. 19, 2021, the entire contents of which are incorporated herein by reference.

FIELD

Embodiments described herein relate generally to a semiconductor device and a semiconductor circuit.

BACKGROUND

An example of a power semiconductor device is an insulated gate bipolar transistor (IGBT). In the IGBT, for example, a p-type collector region, an n-type drift region, and a p-type base region are provided on a collector electrode. Then, a gate electrode is provided in a trench penetrating through the p-type base region and reaching the n-type drift region with a gate insulating film interposed therebetween. Furthermore, an n-type emitter region connected to an emitter electrode is provided in a region adjacent to the trench and on a surface of the p-type base region.

In the IGBT, a channel is formed in the p-type base region by applying a positive voltage equal to or higher than a threshold voltage to the gate electrode. Then, electrons are injected from the n-type emitter region into the n-type drift region, and holes are injected from the collector region into the n-type drift region at the same time. As a result, a current using electrons and holes as carriers flows between the collector electrode and the emitter electrode.

In the IGBT, it is desirable to reduce a switching loss in order to reduce power consumption. The switching loss includes a turn-on loss generated when the IGBT is turned on and a turn-off loss generated when the IGBT is turned off.

DETAILED DESCRIPTION

Figure 1:
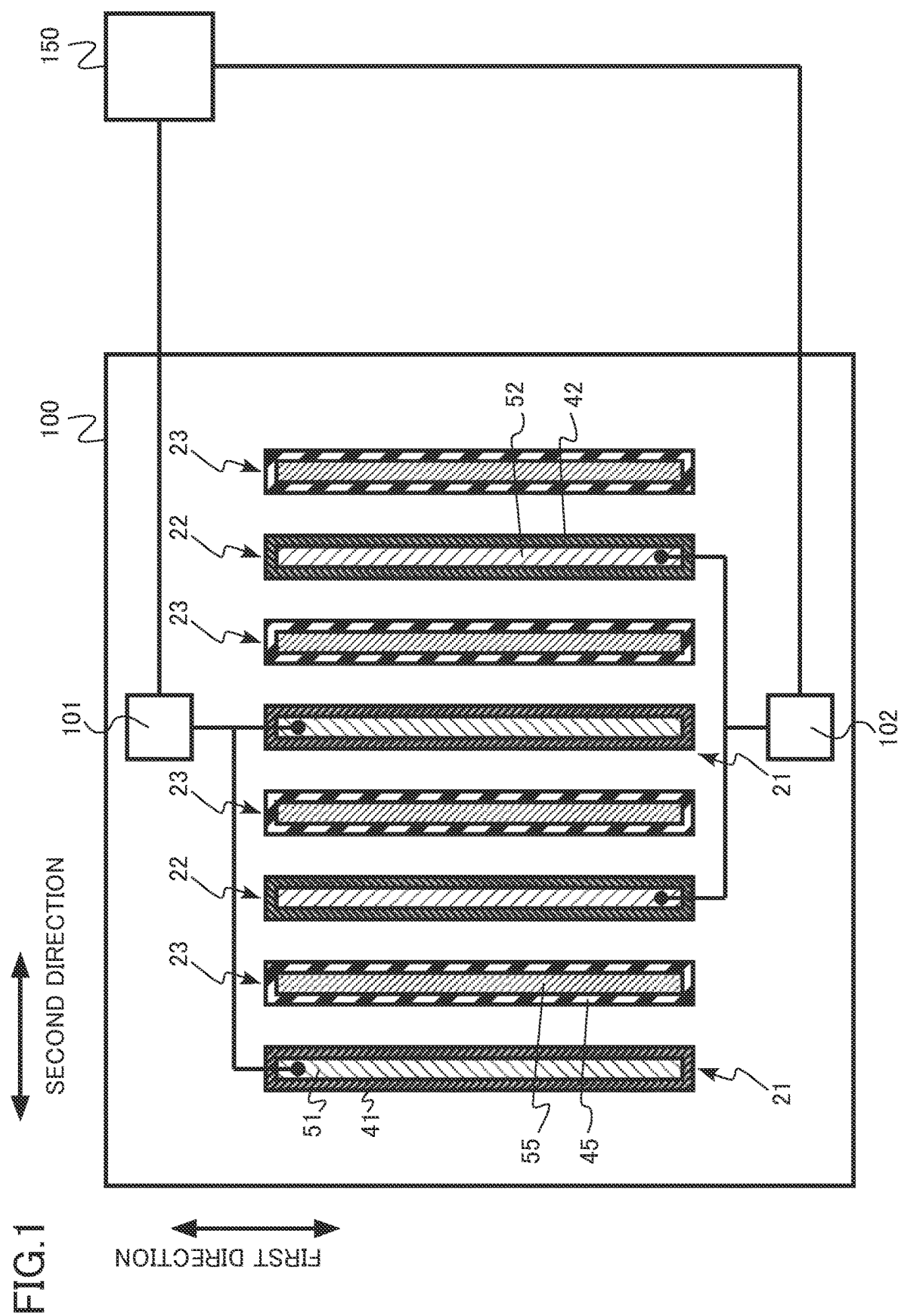
FIG. 1 is a schematic diagram of a semiconductor circuit in a first embodiment.

A semiconductor device according to an embodiment includes: a semiconductor layer having a first face and a second face facing the first face, the semiconductor layer including a first semiconductor region of a first conductivity type, a second semiconductor region of a second conductivity type, the second semiconductor region provided between the first semiconductor region and the first face, a third semiconductor region of the first conductivity type, the third semiconductor region provided between the second semiconductor region and the first face, a fourth semiconductor region of the second conductivity type, the fourth semiconductor region provided between the third semiconductor region and the first face, a first trench provided in a first face side, and a second trench provided in the first face side; a first gate electrode provided in the first trench; a first gate insulating film provided between the first gate electrode and the second semiconductor region, between the first gate electrode and the third semiconductor region, and between the first gate electrode and the fourth semiconductor region, the first gate insulating film being in contact with the fourth semiconductor region; a first conductive layer provided in the first trench and between the first gate electrode and the second face, the first conductive layer being electrically separated from the first gate electrode; a first insulating film provided between the first conductive layer and the second semiconductor region; a second gate electrode provided in the second trench; a second gate insulating film provided between the second gate electrode and the second semiconductor region and between the second gate electrode and the third semiconductor region; a second conductive layer provided in the second trench and between the second gate electrode and the second face; a second insulating film provided between the second conductive layer and the second semiconductor region; a first electrode provided on the first face side of the semiconductor layer, the first electrode being electrically connected to the fourth semiconductor region; a second electrode provided on a second face side of the semiconductor layer, the second electrode being electrically connected to the first semiconductor region; a first gate electrode pad provided on the first face side of the semiconductor layer, the first gate electrode pad being electrically connected to the first gate electrode and having a first gate voltage applied; and a second gate electrode pad provided on the first face side of the semiconductor layer, the second gate electrode pad being electrically connected to the second gate electrode and having a second gate voltage applied.

Hereinafter, embodiments of this disclosure will be described with reference to the Drawings. Note that in the following description, the same or similar members have the same reference numerals, and the description of the members already described may be omitted, if appropriate.

As used herein, when denoted by $n^+$ type, n type, and $n^-$ type, it means that the n-type dopant concentration decreases in the order of the $n^+$ type, the n type, and the $n^-$ type. In addition, when denoted by $p^+$ type, p type, and $p^-$ type, it means that the p-type dopant concentration decreases in the order of the $p^+$ type, the p type, and the $p^-$ type.

As used herein, the distribution and absolute value of the dopant concentration in each semiconductor region can be measured using, for instance, secondary ion mass spectrometry (SIMS). In addition, the relationship about the relative magnitude of dopant concentration between two semiconductor regions can be determined using, for instance, scanning capacitance microscopy (SCM). In addition, the distribution and absolute value of the dopant concentration can be measured using, for instance, spreading resistance analysis (SRA). The SCM and the SRA can be used to determine the relationship about the relative magnitude and the absolute value of the carrier concentration in each semiconductor region. The dopant activation rate may be assumed and the SCM and the SRA measurement results may be used to calculate the relationship about the relative magnitude of dopant concentration between two semiconductor regions, the distribution of the dopant concentration, and the absolute value of the dopant concentration.

First Embodiment

A semiconductor device according to a first embodiment includes: a semiconductor layer having a first face and a second face facing the first face, the semiconductor layer including a first semiconductor region of a first conductivity type, a second semiconductor region of a second conductivity type, the second semiconductor region provided between the first semiconductor region and the first face, a third semiconductor region of the first conductivity type, the third semiconductor region provided between the second semiconductor region and the first face, a fourth semiconductor region of the second conductivity type, the fourth semiconductor region provided between the third semiconductor region and the first face, a first trench provided in a first face side, and a second trench provided in the first face side; a first gate electrode provided in the first trench; a first gate insulating film provided between the first gate electrode and the second semiconductor region, between the first gate electrode and the third semiconductor region, and between the first gate electrode and the fourth semiconductor region, the first gate insulating film being in contact with the fourth semiconductor region; a first conductive layer provided in the first trench and between the first gate electrode and the second face, the first conductive layer being electrically separated from the first gate electrode; a first insulating film provided between the first conductive layer and the second semiconductor region; a second gate electrode provided in the second trench; a second gate insulating film provided between the second gate electrode and the second semiconductor region and between the second gate electrode and the third semiconductor region; a second conductive layer provided in the second trench and between the second gate electrode and the second face; a second insulating film provided between the second conductive layer and the second semiconductor region; a first electrode provided on the first face side of the semiconductor layer, the first electrode being electrically connected to the fourth semiconductor region; a second electrode provided on a second face side of the semiconductor layer, the second electrode being electrically connected to the first semiconductor region; a first gate electrode pad provided on the first face side of the semiconductor layer, the first gate electrode pad being electrically connected to the first gate electrode and having a first gate voltage applied; and a second gate electrode pad provided on the first face side of the semiconductor layer, the second gate electrode pad being electrically connected to the second gate electrode and having a second gate voltage applied.

A semiconductor circuit in the first embodiment is provided with the above semiconductor device and a control circuit such that the above semiconductor device is driven, and before the first gate voltage is switched from a turn-on voltage to a turn-off voltage, the second gate voltage is changed from a first voltage to a second voltage, if the first conductivity type is p-type, the second voltage is a negative voltage, and if the first conductivity type is n-type, the second voltage is a positive voltage. Note that the turn-on voltage and the turn-off voltage will be defined and described when the driving method in the first embodiment is explained.

The semiconductor circuit in the first embodiment includes, as components, a semiconductor device and a control circuit configured to control the semiconductor device.

The semiconductor device of the first embodiment is a trench gate-type IGBT 100 including a gate electrode into a trench formed in a semiconductor layer. The IGBT 100 is an IGBT allowing for double gate driving. The following describes, as an example, the case where the first conductivity type is p-type and the second conductivity type is n-type.

The control circuit in the first embodiment is a gate driver circuit 150.

Figure 2:
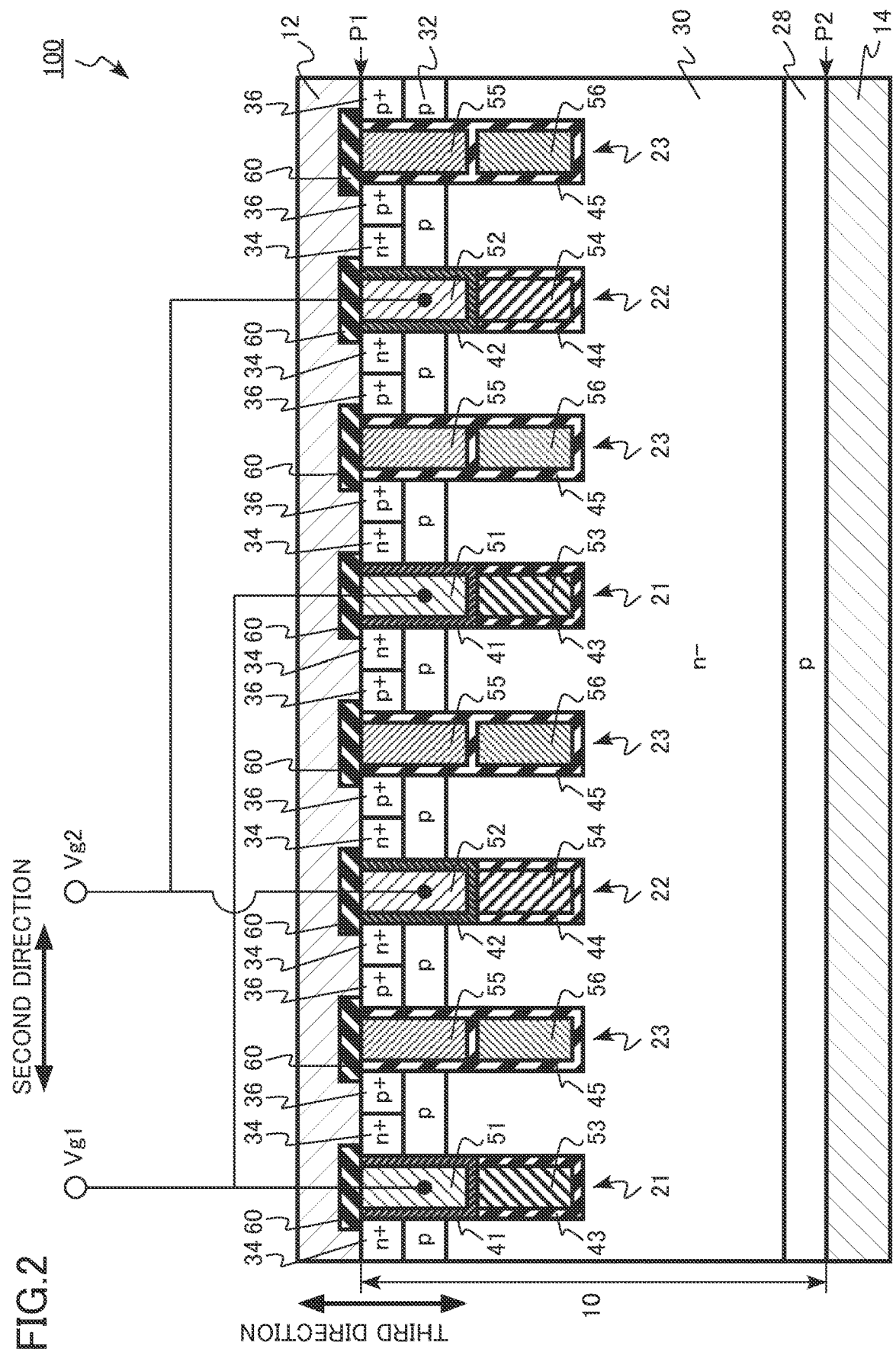
FIG. 2 is a schematic cross-sectional view of a semiconductor device of the first embodiment.
Figure 3:
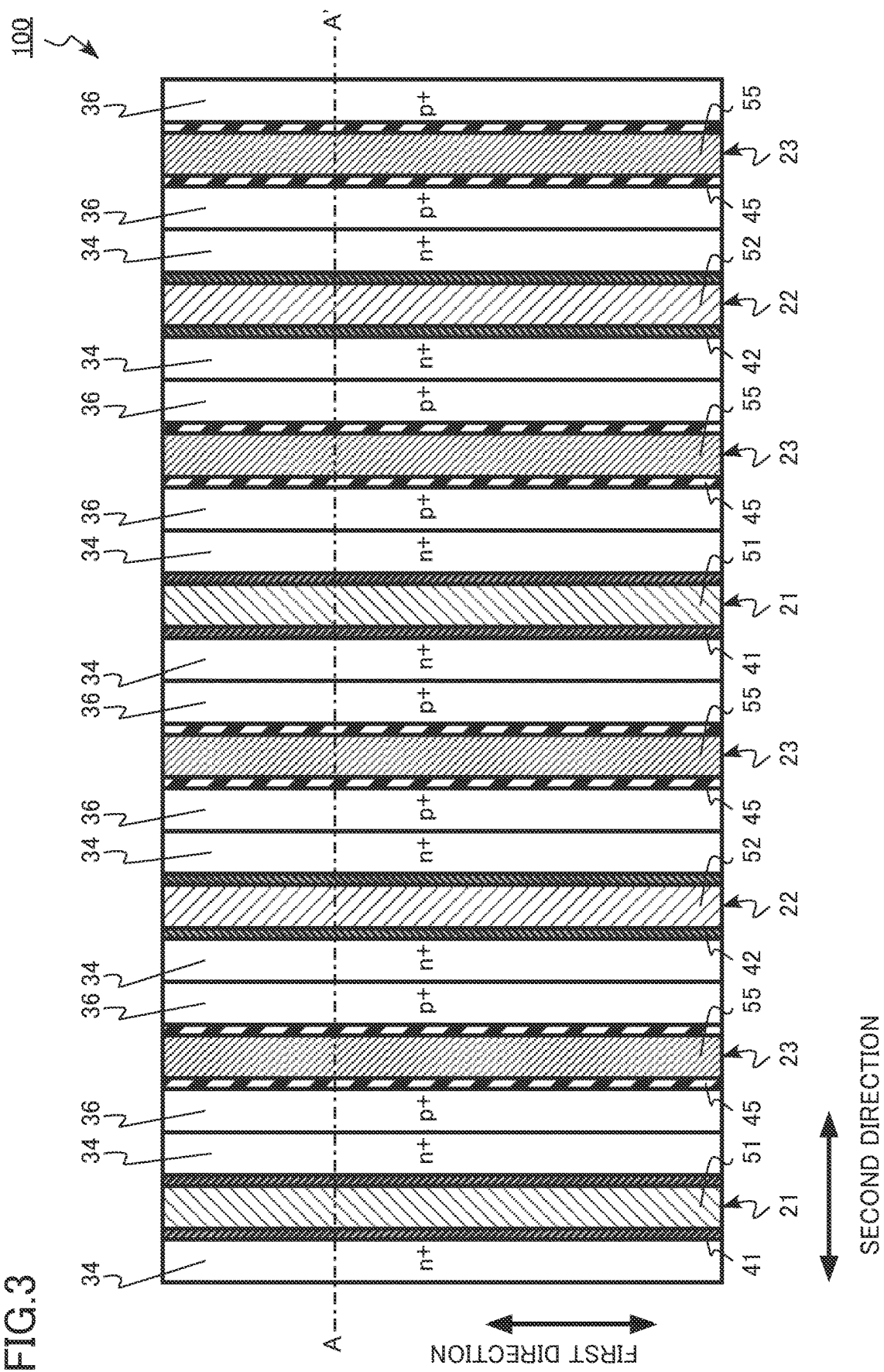
FIG. 3 is a schematic top view of the semiconductor device of the first embodiment.

FIG. 1 is a schematic diagram of a semiconductor circuit in the first embodiment. FIG. 1 illustrates how to dispose and connect first trenches, second trenches, third trenches, first gate electrodes, second gate electrodes, upper conductive layers, first gate insulating films, second gate insulating films, trench insulating films, a first gate electrode pad, a second gate electrode pad, and a control circuit. FIG. 2 is a schematic cross-sectional view of the semiconductor device of the first embodiment. FIG. 3 is a schematic top view of the semiconductor device of the first embodiment. FIG. 3 is a top view of the first face P1. FIG. 2 is a cross section taken along line AA' in FIG. 3.

The IGBT 100 of the first embodiment includes a semiconductor layer 10, an emitter electrode 12 (first electrode), a collector electrode 14 (second electrode), a first gate insulating film 41, a second gate insulating film 42, a first insulating film 43, a second insulating film 44, a trench insulating film 45, a first gate electrode 51, a second gate electrode 52, a first conductive layer 53, a second conductive layer 54, an upper conductive layer 55, a lower conductive layer 56, an interlayer insulating layer 60, a first gate electrode pad 101, and a second gate electrode pad 102.

The semiconductor layer 10 provides a first gate trench 21 (first trench), a second gate trench 22 (second trench), a dummy trench 23, a collector region 28 (first semiconductor region), a drift region 30 (second semiconductor region), a base region 32 (third semiconductor region), an emitter region 34 (fourth semiconductor region), and a contact region 36.

The emitter electrode 12 is an example of the first electrode. The collector electrode 14 is an example of the second electrode. The first gate trench 21 is an example of the first trench. The second gate trench 22 is an example of the second trench. The dummy trench 23 is an example of the third trench. The collector region 28 is an example of the first semiconductor region. The drift region 30 is an example of the second semiconductor region. The base region 32 is an example of the third semiconductor region. The emitter region 34 is an example of the fourth semiconductor region.

The semiconductor layer 10 has a first face P1 and a second face P2 facing the first face P1. The semiconductor layer 10 is made of, for example, monocrystalline silicon. The semiconductor layer 10 has a film thickness of, for example, 40 μm or more and 700 μm or less.

As used herein, a direction parallel to the first face P1 is referred to as a first direction. A direction parallel to the first face P1 and orthogonal to the first direction is referred to as a second direction. The normal direction of the first face P1 is referred to as a third direction. In addition, as used herein, the "depth" is defined as a distance in the third direction with reference to the first face P1.

The emitter electrode 12 is provided on a side of the first face P1 relative to the semiconductor layer 10. At least part of the emitter electrode 12 is in contact with the first face P1 of the semiconductor layer 10. The emitter electrode 12 is made of, for example, a metal.

The emitter electrode 12 is electrically connected to the emitter region 34 and the contact region 36. An emitter voltage is applied to the emitter electrode 12. The emitter voltage is, for example, 0 V.

The collector electrode 14 is provided on a side of the second face P2 relative to the semiconductor layer 10. At least part of the collector electrode 14 is in contact with the second face P2 of the semiconductor layer 10. The collector electrode 14 is made of, for example, a metal.

The collector electrode 14 is electrically connected to the p-type collector region 28. A collector voltage is applied to the collector electrode 14. The collector voltage is, for example, 200 V or more and 6500 V or less when the IGBT 100 is in an off-state.

The collector region 28 is a p-type semiconductor region. The collector region 28 is electrically connected to the collector electrode 14. The collector region 28 is in contact with the collector electrode 14.

The collector region 28 serves as a supply source of holes when the IGBT 100 is in an on-state.

The drift region 30 is an $n^-$ type semiconductor region. The drift region 30 is provided between the collector region 28 and the first face P1.

The drift region 30 serves as a path of an on-current when the IGBT 100 is in an on-state. The drift region 30 is depleted when the IGBT 100 is in an off-state, and functions to maintain the breakdown voltage of the IGBT 100.

The base region 32 is a p-type semiconductor region. The base region 32 is provided between the drift region 30 and the first face P1.

The depth of the base region 32 is, for example, 4 μm or less. An inversion layer is formed in a portion of the base region 32 facing the first gate electrode 51 when the IGBT 100 is in an on-state. An inversion layer is formed in a portion of the base region 32 facing the second gate electrode 52 when the IGBT 100 is in an on-state. Each of the inversion layers formed in the base region 32 functions as a channel region of a transistor.

The emitter region 34 is an $n_+$ type semiconductor region. The emitter region 34 is provided between the base region 32 and the first face P1. The emitter region 34 extends in the first direction on the first face P1. A plurality of the emitter regions 34 are provided.

At least one of the emitter regions 34 is in contact with the first gate insulating film 41. At least one of the emitter regions 34 is in contact with the second gate insulating film 42. The n-type dopant concentration in the emitter region 34 is higher than the n-type dopant concentration in the drift region 30.

The emitter region 34 is electrically connected to the emitter electrode 12. The emitter region 34 is in contact with the emitter electrode 12. The emitter region 34 serves as a supply source of electrons when the transistor having the first gate electrode 51 is in an on-state. The emitter region 34 serves as a supply source of electrons when the transistor having the second gate electrode 52 is in an on-state.

The contact region 36 is a $p^+$ type semiconductor region. The contact region 36 is provided between the base region 32 and the first face P1. The contact region 36 extends in the first direction on the first face P1.

The p-type dopant concentration in the contact region 36 is higher than the p-type dopant concentration in the base region 32. The contact region 36 is electrically connected to the emitter electrode 12.

As illustrated in FIG. 3, the first gate trench 21 extends, on the first face P1, in the first direction parallel to the first face P1. The first gate trench 21 is shaped like a stripe. A plurality of the first gate trenches 21 are repeatedly disposed in the second direction orthogonal to the first direction.

Each first gate trench 21 penetrates through the base region 32 and reaches the drift region 30. The depth of the first gate trench 21 is, for example, 4 μm or more and 8 μm or less.

The first gate electrode 51 is provided in the first gate trench 21. The first gate electrode 51 is made of, for example, a semiconductor or a metal. The first gate electrode 51 is made of, for example, amorphous silicon or polycrystalline silicon containing n-type or p-type dopants. The first gate electrode 51 is electrically connected to the first gate electrode pad 101.

The first gate insulating film 41 is provided between the first gate electrode 51 and the semiconductor layer 10. The first gate insulating film 41 is provided between the first gate electrode 51 and the drift region 30, between the first gate electrode 51 and the base region 32, and between the first gate electrode 51 and the emitter region 34. The first gate insulating film 41 is in contact with the drift region 30, the base region 32, and the emitter region 34. The first gate insulating film 41 is made of, for example, silicon oxide.

The first conductive layer 53 is provided in the first gate trench 21. The first conductive layer 53 is provided between the first gate electrode 51 and the second face P2. The first conductive layer 53 is made of, for example, a semiconductor or a metal. The first conductive layer 53 is made of, for example, amorphous silicon or polycrystalline silicon containing n-type or p-type dopants.

The first gate insulating film 41 is provided between the first conductive layer 53 and the first gate electrode 51.

The first conductive layer 53 is electrically separated from the first gate electrode 51. The first conductive layer 53 is electrically connected to the emitter electrode 12.

The first insulating film 43 is provided between the first conductive layer 53 and the semiconductor layer 10. The first insulating film 43 is provided between the first conductive layer 53 and the drift region 30. The first insulating film 43 is in contact with the drift region 30. The first insulating film 43 is made of, for example, silicon oxide.

As illustrated in FIG. 3, the second gate trench 22 extends, on the first face P1, in the first direction parallel to the first face P1. The second gate trench 22 is shaped like a stripe. The second gate trenches 22 are repeatedly disposed in the second direction orthogonal to the first direction. The second gate trench 22 is provided between the first gate trenches 21.

The second gate trench 22 penetrates through the base region 32 and reaches the drift region 30. The depth of the second gate trench 22 is, for example, 4 μm or more and 8 μm or less.

The second gate electrode 52 is provided in the second gate trench 22. The second gate electrode 52 is made of, for example, a semiconductor or a metal. The second gate electrode 52 is made of, for example, amorphous silicon or polycrystalline silicon containing n-type or p-type dopants. The second gate electrode 52 is electrically connected to the second gate electrode pad 102.

The second gate insulating film 42 is provided between the second gate electrode 52 and the semiconductor layer 10. The second gate insulating film 42 is provided between the second gate electrode 52 and the drift region 30, between the second gate electrode 52 and the base region 32, and between the second gate electrode 52 and the emitter region 34. The second gate insulating film 42 is in contact with the drift region 30, the base region 32, and the emitter region 34. The second gate insulating film 42 is made of, for example, silicon oxide.

The second conductive layer 54 is provided in the second gate trench 22. The second conductive layer 54 is provided between the second gate electrode 52 and the second face P2. The second conductive layer 54 is made of, for example, a semiconductor or a metal. The second conductive layer 54 is made of, for example, amorphous silicon or polycrystalline silicon containing n-type or p-type dopants.

The second gate insulating film 42 is provided between the second conductive layer 54 and the second gate electrode 52.

The second conductive layer 54 is electrically separated from the second gate electrode 52. The second conductive layer 54 is electrically connected to the emitter electrode 12.

The second insulating film 44 is provided between the second conductive layer 54 and the semiconductor layer 10. The second insulating film 44 is provided between the second conductive layer 54 and the drift region 30. The second insulating film 44 is in contact with the drift region 30. The second insulating film 44 is made of, for example, silicon oxide.

As illustrated in FIG. 3, the dummy trench 23 extends, on the first face P1, in the first direction parallel to the first face P1. The dummy trench 23 is shaped like a stripe. The dummy trenches 23 are repeatedly disposed in the second direction orthogonal to the first direction. The dummy trench 23 is provided between the first gate trench 21 and the second gate trench 22.

The dummy trench 23 penetrates through the base region 32 and reaches the drift region 30. The depth of the dummy trench 23 is, for example, 4 μm or more and 8 μm or less.

The upper conductive layer 55 is provided in the dummy trench 23. The upper conductive layer 55 is made of, for example, a semiconductor or a metal. The upper conductive layer 55 is made of, for example, amorphous silicon or polycrystalline silicon containing n-type or p-type dopants. The upper conductive layer 55 is electrically connected to the emitter electrode 12.

The lower conductive layer 56 is provided in the dummy trench 23. The lower conductive layer 56 is provided between the upper conductive layer 55 and the second face P2. The lower conductive layer 56 is made of, for example, a semiconductor or a metal. The lower conductive layer 56 is made of, for example, amorphous silicon or polycrystalline silicon containing n-type or p-type dopants. The lower conductive layer 56 is electrically connected to the emitter electrode 12.

The trench insulating film 45 is provided between the upper conductive layer 55 and the semiconductor layer 10. The trench insulating film 45 is also provided between the lower conductive layer 56 and the semiconductor layer 10. In addition, the trench insulating film 45 is provided between the upper conductive layer 55 and the lower conductive layer 56. The trench insulating film 45 is made of, for example, silicon oxide.

The interlayer insulating layer 60 is provided between the first gate electrode 51 and the emitter electrode 12. The interlayer insulating layer 60 electrically isolates the first gate electrode 51 from the emitter electrode 12. The interlayer insulating layer 60 is provided between the second gate electrode 52 and the emitter electrode 12. The interlayer insulating layer 60 electrically isolates the second gate electrode 52 from the emitter electrode 12. The interlayer insulating layer 60 is also provided between the upper conductive layer 55 and the emitter electrode 12. The interlayer insulating layer 60 is made of, for example, silicon oxide.

The first gate electrode pad 101 is provided on a side of the first face P1 relative to the semiconductor layer 10. The first gate electrode pad 101 is electrically connected to the first gate electrode 51. The first gate electrode pad 101 and the first gate electrode 51 are connected by, for example, metal wiring (not shown).

A first gate voltage (Vg1) is applied to the first gate electrode pad 101. The first gate voltage (Vg1) is then applied to the first gate electrode 51.

The second gate electrode pad 102 is electrically connected to the second gate electrode 52. The second gate electrode pad 102 and the second gate electrode 52 are connected by, for example, metal wiring (not shown).

A second gate voltage (Vg2) is applied to the second gate electrode pad 102. The second gate voltage (Vg2) is then applied to the second gate electrode 52.

The gate driver circuit 150 is provided, for example, in the same module as of the IGBT 100 or on the same circuit board as of the IGBT 100. The gate driver circuit 150 functions to drive the IGBT 100.

The gate driver circuit 150 functions to apply a desired first gate voltage (Vg1) to the first gate electrode pad 101 at a desired timing. The gate driver circuit 150 functions to apply a desired second gate voltage (Vg2) to the second gate electrode pad 102 at a desired timing.

The gate driver circuit 150 changes the second gate voltage (Vg2) from the first voltage to the second voltage before the first gate voltage (Vg1) is switched from the turn-on voltage to the turn-off voltage. If the first conductivity type is p-type, the second voltage is a negative voltage, and if the first conductivity type is n-type, the second voltage is a positive voltage.

Next, a method of driving the IGBT 100 will be described.

Figure 4:
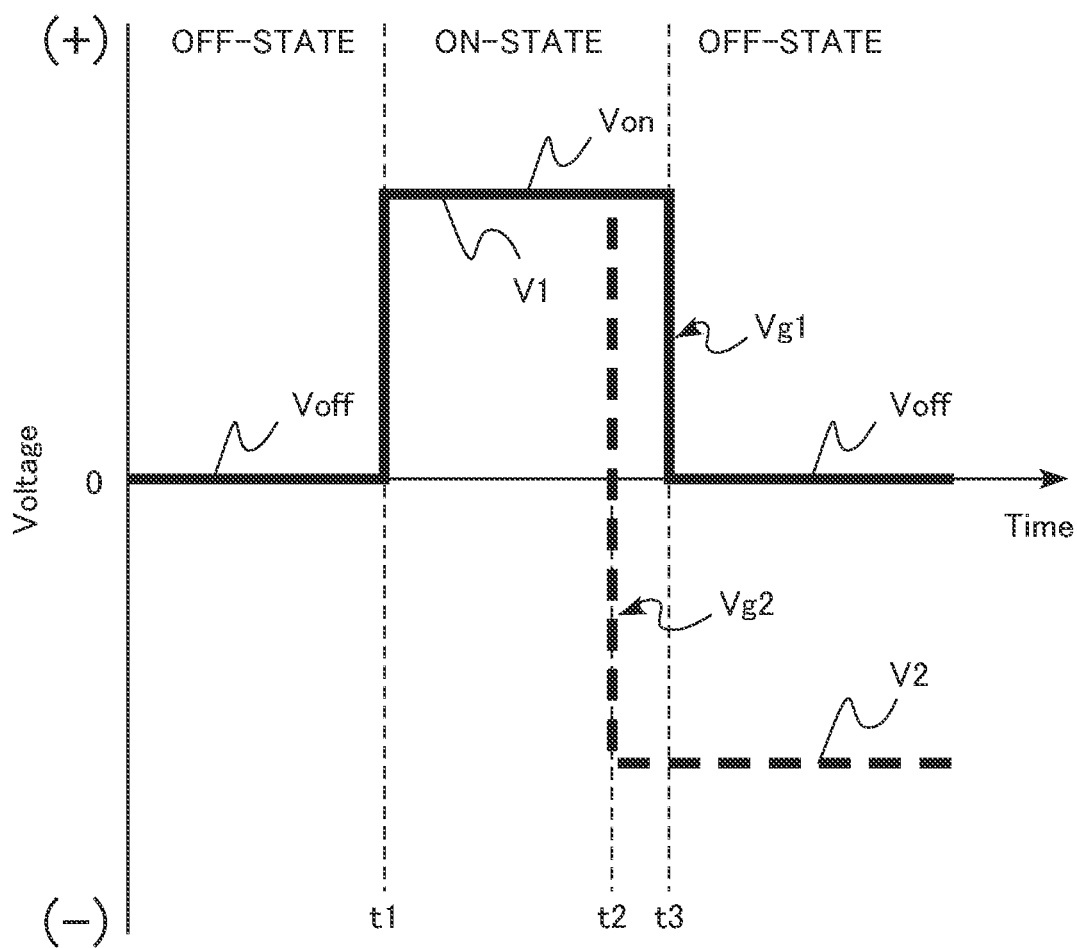
FIG. 4 is a chart illustrating an example of how to drive the semiconductor device of the first embodiment.

FIG. 4 is a chart illustrating an example of a method of driving the semiconductor device according to the first embodiment. FIG. 4 is a timing chart of the first gate voltage (Vg1) applied to the first gate electrode pad 101 and the second gate voltage (Vg2) applied to the second gate electrode pad 102.

The structure of a transistor having the first gate electrode 51 or the structure of a transistor having the second gate electrode 52 is not a clearly separated structure. However, for convenience of description of the operation, they are hereinafter expressed as a transistor having the first gate electrode 51 or a transistor having the second gate electrode 52.

If the IGBT 100 is in an off-state, for example, an emitter voltage is applied to the emitter electrode 12. The emitter voltage is, for example, 0 V. A collector voltage is applied to the collector electrode 14. The collector voltage is, for example, 200 V or more and 6500 V or less.

If the IGBT 100 is in an off-state, a turn-off voltage (Voff) is applied to the first gate electrode pad 101. Here, the first gate voltage (Vg1) is the turn-off voltage (Voff). Thus, the turn-off voltage (Voff) is also applied to the first gate electrode 51.

If the IGBT 100 is in an off-state, the same turn-off voltage (Voff) is applied to the first gate electrode pad 101 and the second gate electrode pad 102. The turn-off voltage (Voff) is a voltage lower than a threshold voltage at which the transistor having the first gate electrode 51 is turned on, and is, for example, 0 V or a negative voltage.

If the state is off, no n-type inversion layer is formed in the base region 32 facing the first gate electrode 51 and in contact with the first gate insulating film 41.

If the IGBT 100 is in an off-state, a turn-off voltage (Voff) is applied to the second gate electrode pad 102. Here, the second gate voltage (Vg2) is the turn-off voltage (Voff). Thus, the turn-off voltage (Voff) is also applied to the second gate electrode 52.

The turn-off voltage (Voff) is a voltage lower than a threshold voltage at which the transistor having the second gate electrode 52 is turned on, and is, for example, 0 V or a negative voltage.

If the state is off, no n-type inversion layer is formed in the base region 32 facing the second gate electrode 52 and in contact with the second gate insulating film 42.

When the IGBT 100 is turned on (at time t1 in FIG. 4), a turn-on voltage (Von) is applied to the first gate electrode pad 101. Here, the first gate voltage (Vg1) is the turn-on voltage (Von). The turn-on voltage (Von) is also applied to the first gate electrode 51.

The turn-on voltage (Von) is a positive voltage exceeding the threshold voltage of the transistor having the first gate electrode 51. The turn-on voltage (Von) is, for example, 15 V. The turn-on voltage (Von) is applied to the first gate electrode 51 to turn on the transistor having the first gate electrode 51.

When the IGBT 100 is turned on (at time t1 in FIG. 4), the first voltage (V1) is also applied to the second gate electrode pad 102. Here, the second gate voltage (Vg2) is the first voltage (V1).

The first voltage (V1) is equal to the turn-on voltage (Von). The turn-on voltage (Von) is also applied to the second gate electrode 52. The turn-on voltage (Von) is applied to the second gate electrode 52 to turn on the transistor having the second gate electrode 52.

When the IGBT 100 is turned off (at time t3 in FIG. 4), a turn-off voltage (Voff) is applied to the first gate electrode pad 101. Here, the first gate voltage (Vg1) is the turn-off voltage (Voff).

Before the first gate voltage (Vg1) is switched from the turn-on voltage (Von) to the turn-off voltage (Voff), that is, prior to time t3, the second gate voltage (Vg2) is changed from the first voltage (V1) to the second voltage (V2). The voltage applied to the second gate electrode pad 102 is changed from the first voltage (V1) to the second voltage (V2) at time t2.

The second voltage (V2) is a negative voltage. The second voltage (V2) is, for example, −15 V or more and less than 0 V. When the second voltage (V2) is applied to the second gate electrode pad 102, the second voltage (V2) is then applied to the second gate electrode 52. The second voltage (V2) is applied to the second gate electrode 52 to turn off the transistor having the second gate electrode 52. This blocks injection of electrons from the emitter region 34 in contact with the second gate insulating film 42.

In addition, the second voltage (V2) is applied to the second gate electrode 52 to form a p-type inversion layer in the drift region 30 in contact with the second gate insulating film 42.

Next, functions and effects of the semiconductor device according to the first embodiment will be described.

In the IGBT, it is desirable to reduce a switching loss in order to reduce power consumption. The switching loss includes a turn-on loss generated when the IGBT is turned on and a turn-off loss generated when the IGBT is turned off.

In order to reduce the turn-on loss, it is effective to reduce the collector-gate capacitance Cgc of the IGBT. The collector-gate capacitance Cgc is reduced to increase the decreasing rate of the collector-emitter voltage Vce at the time of turn-on. This causes the turn-on loss to decrease.

In the IGBT 100 of the first embodiment, the first conductive layer 53 having a fixed emitter electric potential is provided under the first gate electrode 51. The first conductive layer 53 is so provided to shield coupling between the first gate electrode 51 and the collector. This can reduce the collector-gate capacitance Cgc of the IGBT 100. Thus, the turn-on loss of the IGBT 100 is reduced.

In order to reduce the on-resistance of the IGBT, it is effective to increase the carrier concentration in the drift region when the state is on. Meanwhile, when the IGBT is turned off, discharge of carriers from the drift region may be delayed. In this case, the turn-off time becomes longer, and the switching loss thus increases.

The IGBT 100 of the first embodiment includes the first gate electrode 51 in the first gate trench 21 and the second gate electrode 52 in the second gate trench 22. The first gate voltage (Vg1) applied to the first gate electrode 51 and the second gate voltage (Vg2) applied to the second gate electrode 52 are independently controlled.

In the IGBT 100, the second gate voltage (Vg2) is set to a negative voltage before the first gate voltage (Vg1) is switched from the turn-on voltage (Von) to the turn-off voltage (Voff). The second gate voltage (Vg2) is set to a negative voltage, so that a p-type inversion layer is formed in the drift region 30 facing the second gate electrode 52 and in contact with the second gate insulating film 42.

Holes in the drift region 30 are discharged to the emitter electrode 12 through the p-type inversion layer. This can lower the carrier accumulation amount in the drift region 30 on a side of the first face P1.

When the first gate voltage (Vg1) is switched from the turn-on voltage (Von) to the turn-off voltage (Voff) (at time t3 in FIG. 4), the carrier accumulation amount in the drift region 30 on the side of the first face P1 has already been decreased. This shortens the turn-off time. Thus, the turn-off loss of the IGBT 100 is reduced.

Note that the second voltage (V2) may be set to 0 V (zero volts) instead of the negative voltage. Even if the second voltage (V2) is set to 0 V, the transistor having the second gate electrode 52 is turned off. This blocks injection of electrons from the emitter region 34 in contact with the second gate insulating film 42. This can also lower the carrier accumulation amount in the drift region 30 on a side of the first face P1, thereby shortening the turn-off time. Thus, the turn-off loss of the IGBT 100 is reduced.

Figure 5:
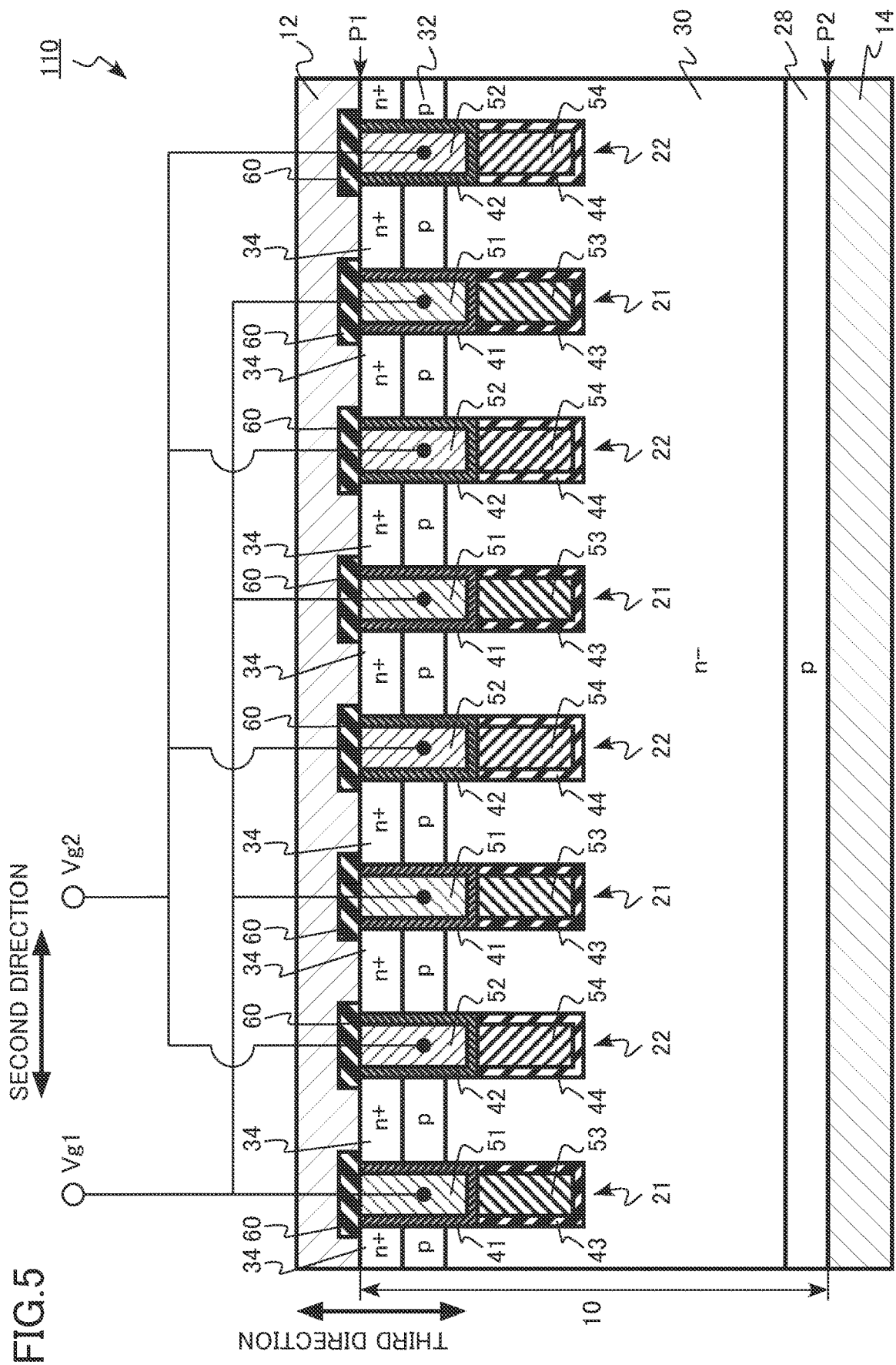
FIG. 5 is a schematic cross-sectional view of a modification embodiment of the semiconductor device of the first embodiment.

FIG. 5 is a schematic cross-sectional view of a modification embodiment of the semiconductor device of the first embodiment. This IGBT 110 of the modification embodiment differs from the IGBT 100 of the first embodiment. The difference is that no dummy trench 23 is provided in the semiconductor layer 10.

In FIG. 5, the contact region 36 is not depicted. The contact region 36 is provided, for example, in the first direction of the emitter region 34.

As described above, according to the IGBT of the first embodiment or the IGBT of the modification embodiment, the switching loss can be reduced. In addition, the semiconductor circuit including the IGBT of the first embodiment or the semiconductor circuit including the IGBT of the modification embodiment makes it possible to reduce the switching loss.

Second Embodiment

A semiconductor device of a second embodiment differs from the semiconductor device of the first embodiment. The difference is that the second conductive layer is electrically connected to the second gate electrode pad. Hereinafter, description of contents overlapping with the first embodiment may be partially omitted.

The semiconductor device of the second embodiment is a trench gate-type IGBT 200 including a gate electrode into a trench formed in a semiconductor layer.

Figure 6:
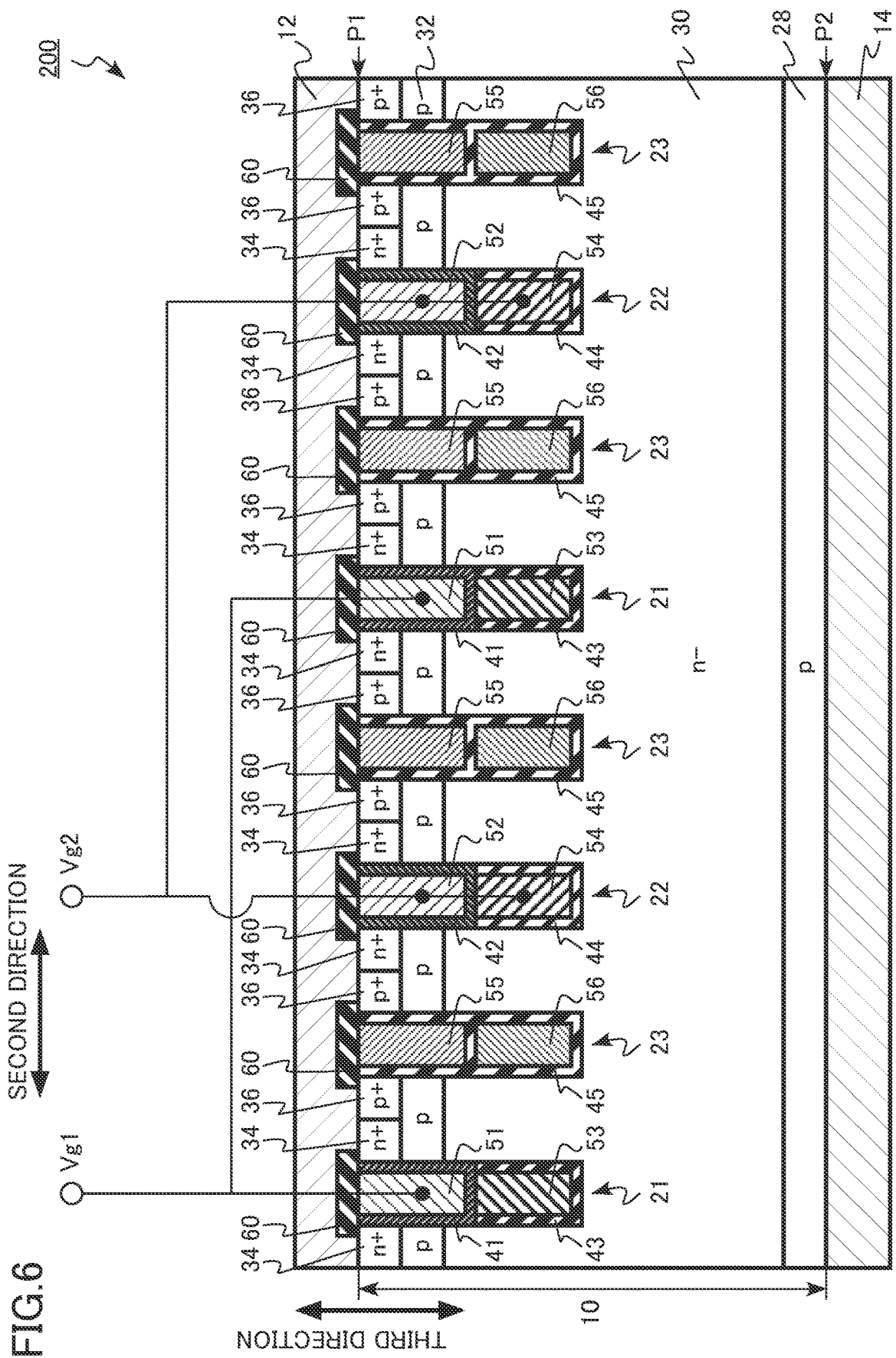
FIG. 6 is a schematic cross-sectional view of a semiconductor device according to a second embodiment.

FIG. 6 is a schematic cross-sectional view of the semiconductor device of the second embodiment.

The second conductive layer 54 of the IGBT 200 is electrically connected to the second gate electrode pad 102. The second conductive layer 54 is also electrically connected to the second gate electrode 52.

When the IGBT 200 is turned off (at time t3 in FIG. 4), a turn-off voltage (Voff) is applied to the first gate electrode pad 101. Here, the first gate voltage (Vg1) is the turn-off voltage (Voff).

Before the first gate voltage (Vg1) is switched from the turn-on voltage (Von) to the turn-off voltage (Voff), that is, prior to time t3, the second gate voltage (Vg2) is changed from the first voltage (V1) to the second voltage (V2). The voltage applied to the second gate electrode pad 102 is changed from the first voltage (V1) to the second voltage (V2) at time t2.

The second voltage (V2) is a negative voltage. The second voltage (V2) is, for example, −15 V or more and less than 0 V. When the second voltage (V2) is applied to the second gate electrode pad 102, the second voltage (V2) is applied to the second gate electrode 52 and the second conductive layer 54.

The second voltage (V2) is applied to the second gate electrode 52 and the second conductive layer 54, so that a p-type inversion layer is formed in each of the drift region 30 in contact with the second gate insulating film 42 and the drift region 30 in contact with the second insulating film 44.

This can cause the area of the p-type inversion layer formed in the drift region 30 to be wider in the IGBT 200 than in the IGBT 100 when the second voltage (V2) is applied to the second gate electrode 52. Accordingly, when compared to the IGBT 100 of the first embodiment, discharge of holes to the emitter electrode 12 during the turn-off operation is promoted. Thus, the IGBT 200 makes it possible to further reduce the turn-off loss.

As described above, the IGBT of the second embodiment makes it possible to reduce the switching loss.

Third Embodiment

A semiconductor device according to a third embodiment includes: a semiconductor layer having a first face and a second face facing the first face, the semiconductor layer including a first semiconductor region of a first conductivity type, a second semiconductor region of a second conductivity type, the second semiconductor region provided between the first semiconductor region and the first face, a third semiconductor region of the first conductivity type, the third semiconductor region provided between the second semiconductor region and the first face, a fourth semiconductor region of the second conductivity type, the fourth semiconductor region provided between the third semiconductor region and the first face, a first trench provided on a side of the first face, and a second trench provided on a side of the first face; a first gate electrode provided in the first trench; a first gate insulating film provided between the first gate electrode and the second semiconductor region, between the first gate electrode and the third semiconductor region, and between the first gate electrode and the fourth semiconductor region, the first gate insulating film being in contact with the fourth semiconductor region; a first conductive layer provided in the first trench and between the first gate electrode and the second face, the first conductive layer being electrically separated from the first gate electrode; a first insulating film provided between the first conductive layer and the second semiconductor region; a second gate electrode provided in the second trench; a second gate insulating film provided between the second gate electrode and the second semiconductor region, between the second gate electrode and the third semiconductor region, and between the second gate electrode and the fourth semiconductor region, the second gate insulating film being in contact with the fourth semiconductor region; a first electrode provided on a side of the first face relative to the semiconductor layer, the first electrode being electrically connected to the fourth semiconductor region and the first conductive layer; a second electrode provided on a side of the second face relative to the semiconductor layer, the second electrode being electrically connected to the first semiconductor region; a first gate electrode pad provided on a side of the first face relative to the semiconductor layer, the first gate electrode pad being electrically connected to the first gate electrode and having a first gate voltage applied; and a second gate electrode pad provided on a side of the first face relative to the semiconductor layer, the second gate electrode pad being electrically connected to the second gate electrode and having a second gate voltage applied. The semiconductor device and a semiconductor circuit in the third embodiment differ from the semiconductor device of the first embodiment. The difference is that no second conductive layer is provided in the second trench. Hereinafter, description of contents overlapping with the first embodiment may be partially omitted.

The semiconductor device of the third embodiment is a trench gate-type IGBT 300 including a gate electrode into a trench formed in a semiconductor layer.

Figure 7:
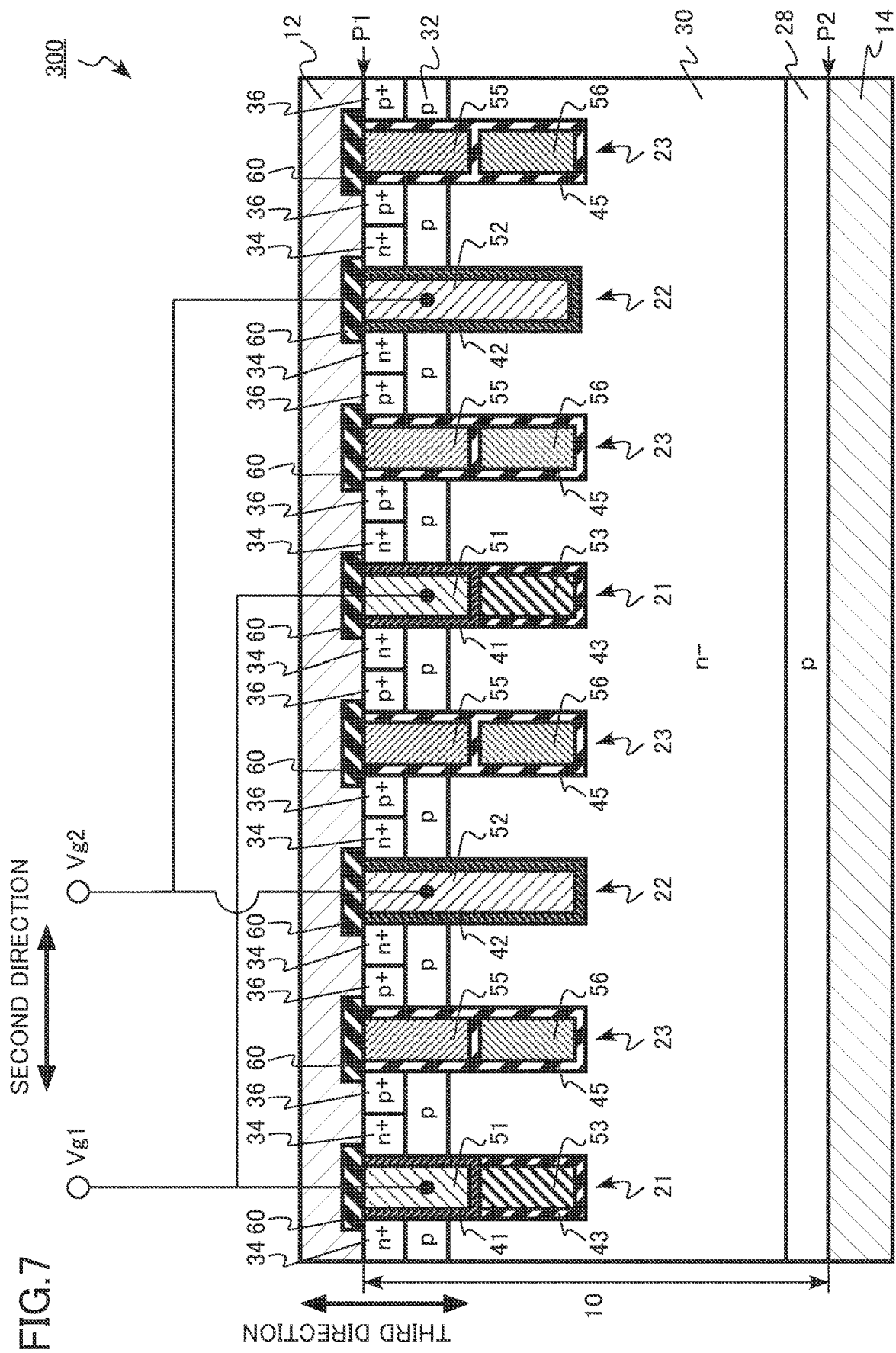
FIG. 7 is a schematic cross-sectional view of a semiconductor device according to a third embodiment.

FIG. 7 is a schematic cross-sectional view of the semiconductor device of the third embodiment.

In the IGBT 300, the second gate trench 22 is free of a conductive layer corresponding to the second conductive layer 54 of the IGBT 100.

When the second voltage (V2) is applied to the second gate electrode 52 during the turn-off operation of the IGBT 300, the area of the drift region 30 in contact with the second gate insulating film 42 is larger than that of the IGBT 100 of the first embodiment. This can cause the area of the p-type inversion layer formed in the drift region 30 to be wider in the IGBT 300 than in the IGBT 100 when the second voltage (V2) is applied to the second gate electrode 52.

Accordingly, when compared to the IGBT 100 of the first embodiment, discharge of holes to the emitter electrode 12 during the turn-off operation is promoted. Thus, the IGBT 300 makes it possible to further reduce the switching loss.

As described above, the IGBT of the third embodiment makes it possible to reduce the switching loss.

Fourth Embodiment

A semiconductor device of a fourth embodiment differs from the semiconductor device according to the second embodiment. The difference is that the second gate insulating film is spaced from the fourth semiconductor region. Hereinafter, description of contents overlapping with the first or second embodiment may be partially omitted.

The semiconductor device of the fourth embodiment is a trench gate-type IGBT 400 including a gate electrode into a trench formed in a semiconductor layer.

Figure 8:
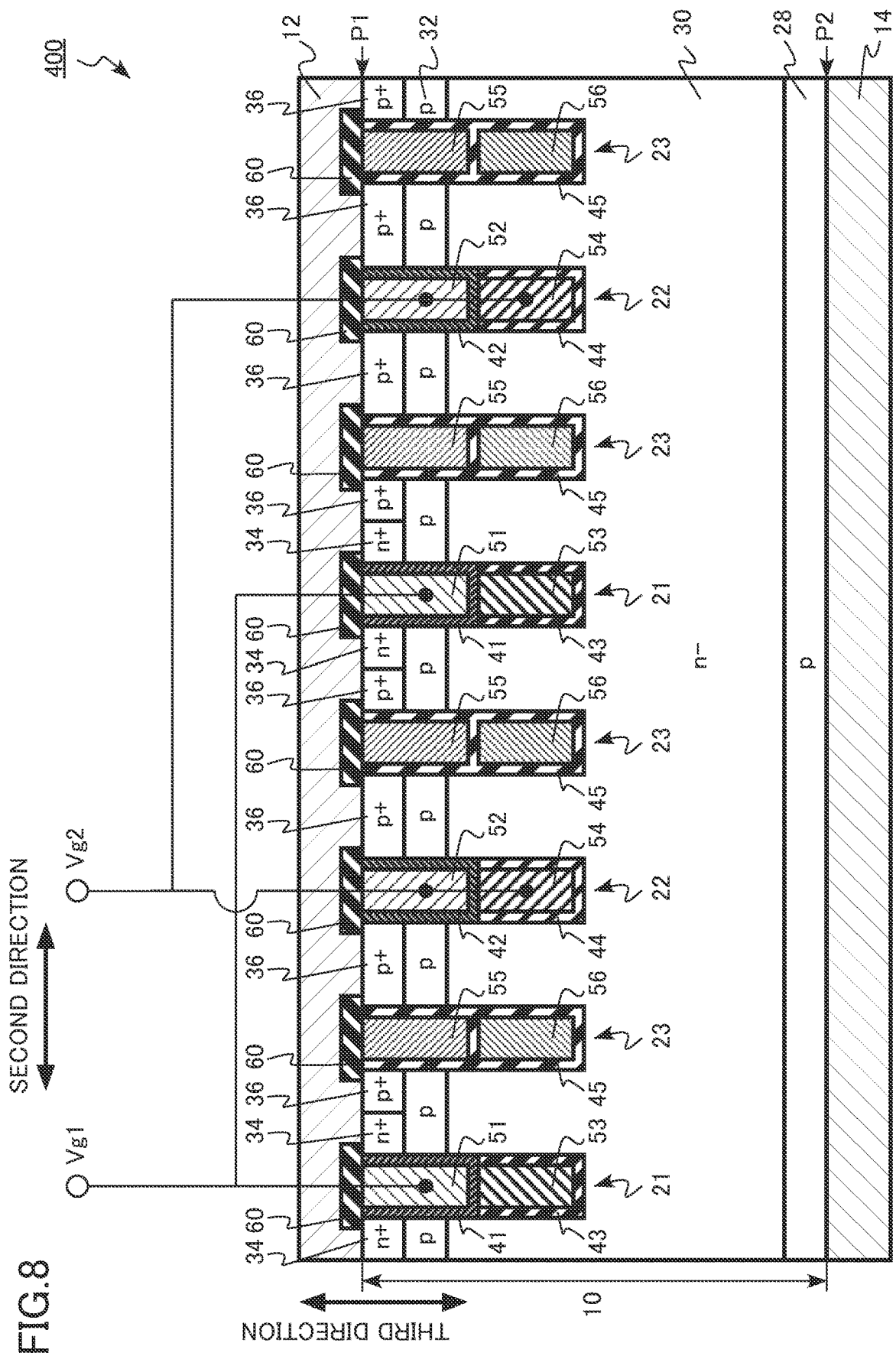
FIG. 8 is a schematic cross-sectional view of a semiconductor device according to a fourth embodiment.

FIG. 8 is a schematic cross-sectional view of the semiconductor device of the fourth embodiment.

No emitter region 34 is provided between the second gate trench 22 and the dummy trench 23 of the IGBT 400. The second gate insulating film 42 is apart from the emitter region 34. That is, the second gate insulating film 42 is not in contact with the emitter region 34.

The second conductive layer 54 of the IGBT 400 is electrically connected to the second gate electrode pad 102. The second conductive layer 54 is also electrically connected to the second gate electrode 52.

Figure 9:
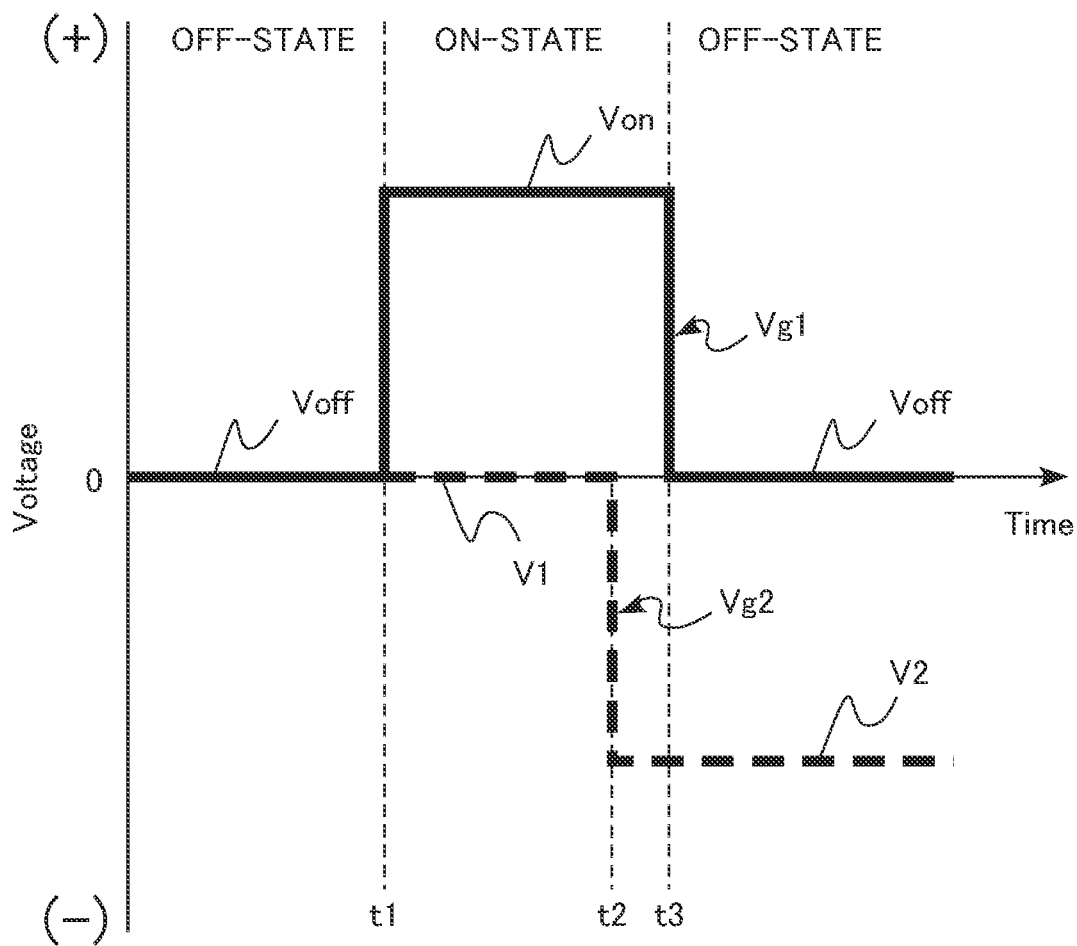
FIG. 9 is a chart illustrating how to drive the semiconductor device of the fourth embodiment.

FIG. 9 is a chart illustrating a method of driving the semiconductor device according to the fourth embodiment. FIG. 9 is a timing chart of the first gate voltage (Vg1) applied to the first gate electrode pad 101 and the second gate voltage (Vg2) applied to the second gate electrode pad 102.

If the IGBT 400 is in an off-state, for example, an emitter voltage is applied to the emitter electrode 12. The emitter voltage is, for example, 0 V. A collector voltage is applied to the collector electrode 14. The collector voltage is, for example, 200 V or more and 6500 V or less.

If the IGBT 400 is in an off-state, a turn-off voltage (Voff) is applied to the first gate electrode pad 101. Here, the first gate voltage (Vg1) is the turn-off voltage (Voff). Thus, the turn-off voltage (Voff) is also applied to the first gate electrode 51.

The turn-off voltage (Voff) is a voltage lower than a threshold voltage at which the transistor having the first gate electrode 51 is turned on, and is, for example, 0 V or a negative voltage.

If the state is off, no n-type inversion layer is formed in the base region 32 facing the first gate electrode 51 and in contact with the first gate insulating film 41.

If the IGBT 400 is in an off-state, a turn-off voltage (Voff) is applied to the second gate electrode pad 102. The turn-off voltage (Voff) is also applied to the second gate electrode 52.

When the IGBT 400 is turned on (at time t1 in FIG. 9), a turn-on voltage (Von) is applied to the first gate electrode pad 101. Here, the first gate voltage (Vg1) is the turn-on voltage (Von). The turn-on voltage (Von) is also applied to the first gate electrode 51.

The turn-on voltage (Von) is a positive voltage exceeding the threshold voltage of the transistor having the first gate electrode 51. The turn-on voltage (Von) is, for example, 15 V. The turn-on voltage (Von) is applied to the first gate electrode 51 to turn on the transistor having the first gate electrode 51.

When the IGBT 400 is turned on (at time t1 in FIG. 9), the voltage applied to the second gate electrode pad 102 is a first voltage (V1). Here, the second gate voltage (Vg2) is the first voltage (V1).

The first voltage (V1) is the turn-off voltage (Voff). If the IGBT 400 is in an on-state, the voltage applied to the second gate electrode pad 102 remains the same as the turn-off voltage (Voff). The voltage applied to the second gate electrode 52 is also kept at the turn-off voltage (Voff). The turn-off voltage (Voff) applied as the first voltage (V1) is preferably not a negative voltage.

When the IGBT 400 is turned off (at time t3 in FIG. 9), a turn-off voltage (Voff) is applied to the first gate electrode pad 101. Here, the first gate voltage (Vg1) is the turn-off voltage (Voff).

Before the first gate voltage (Vg1) is switched from the turn-on voltage (Von) to the turn-off voltage (Voff), that is, prior to time t3, the second gate voltage (Vg2) is changed from the first voltage (V1) to the second voltage (V2). The voltage applied to the second gate electrode pad 102 is changed from the first voltage (V1) to the second voltage (V2) at time t2.

The second voltage (V2) is a negative voltage. The second voltage (V2) is, for example, −15 V or more and less than 0 V. Here, the second voltage (V2) is applied to the second gate electrode pad 102 to form a p-type inversion layer in the drift region 30 in contact with the second gate insulating film 42.

Holes in the drift region 30 are discharged to the emitter electrode 12 through this p-type inversion layer. Thus, the turn-off loss of the IGBT 400 is reduced.

In addition, in the IGBT 400, the turn-on voltage (Von) is not applied to the second gate electrode pad 102 during the turn-on operation. Accordingly, the second gate electrode 52 is maintained at 0 V, which is the turn-off voltage (Voff).

This can reduce the collector-gate capacitance Cgc of the IGBT when compared to that of the IGBT 200 of the second embodiment. Thus, the IGBT 400 makes it possible to further reduce the turn-on loss, thereby further decreasing the switching loss.

As described above, the IGBT of the fourth embodiment makes it possible to reduce the switching loss.

Fifth Embodiment

A semiconductor device of a fifth embodiment differs from the semiconductor device of the third embodiment. One of the differences is that a plurality of second trenches are provided between two third trenches. In addition, the semiconductor device of the fifth embodiment also differs from the semiconductor device of the third embodiment. The other differences are that a distance between the second trench and the third trench is smaller than a distance between the first trench and the third trench, and a distance between two adjacent second trenches is smaller than a distance between the first trench and the third trench. Hereinafter, description of contents overlapping with the first or third embodiment may be partially omitted.

The semiconductor device of the fifth embodiment is a trench gate-type IGBT 500 including a gate electrode into a trench formed in a semiconductor layer.

Figure 10:
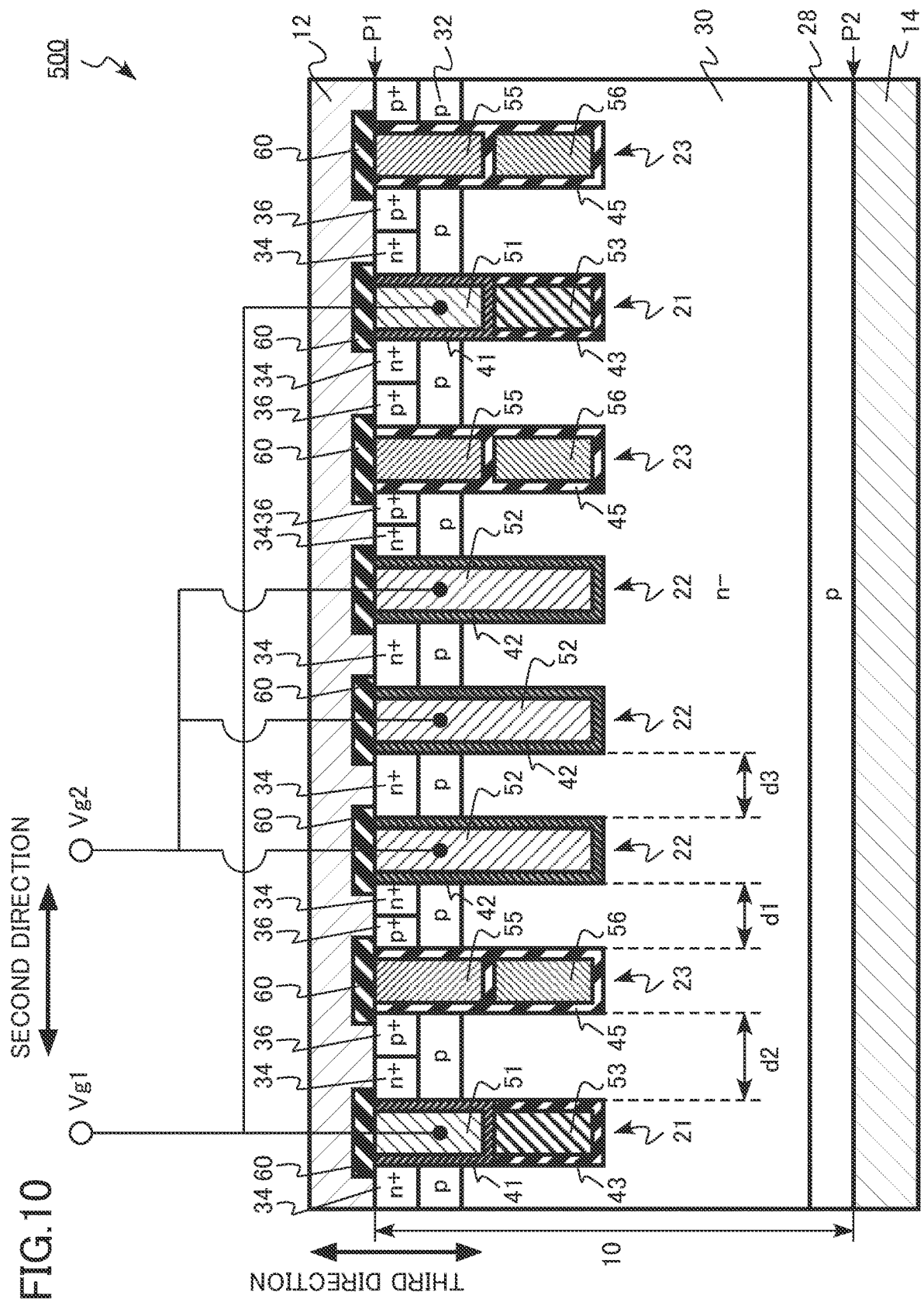
FIG. 10 is a schematic cross-sectional view of a semiconductor device according to a fifth embodiment.

FIG. 10 is a schematic cross-sectional view of the semiconductor device of the fifth embodiment.

In the IGBT 500, three second gate trenches 22 are provided between two dummy trenches 23.

A distance d1 between the second gate trench 22 and the dummy trench 23 is smaller than a distance d2 between the first gate trench 21 and the dummy trench 23. In addition, a distance d3 between the adjacent second gate trenches 22 is smaller than the distance d2 between the first gate trench 21 and the dummy trench 23.

Since the distance d1 is smaller than the distance d2 and the distance d3 is smaller than the distance d2, discharge of holes to the emitter electrode 12 is suppressed. This can increase the carrier concentration when the IGBT is in an on-state. Thus, the on-resistance of the IGBT 500 is reduced.

As described above, the IGBT of the fifth embodiment makes it possible to reduce the switching loss. Further, according to the IGBT of the fifth embodiment, the on-resistance is reduced.

Sixth Embodiment

A semiconductor device of a sixth embodiment differs from the semiconductor device of the third embodiment. One of the differences is that a plurality of second trenches are provided between two third trenches. In addition, the semiconductor device of the sixth embodiment differs from the semiconductor device of the third embodiment. The other differences are that the depth of the second trench is deeper than the depth of the first trench and the depth of the second trench is deeper than the depth of the third trench. Hereinafter, description of contents overlapping with the first or third embodiment may be partially omitted.

The semiconductor device of the sixth embodiment is a trench gate-type IGBT 600 including a gate electrode into a trench formed in a semiconductor layer.

Figure 11:
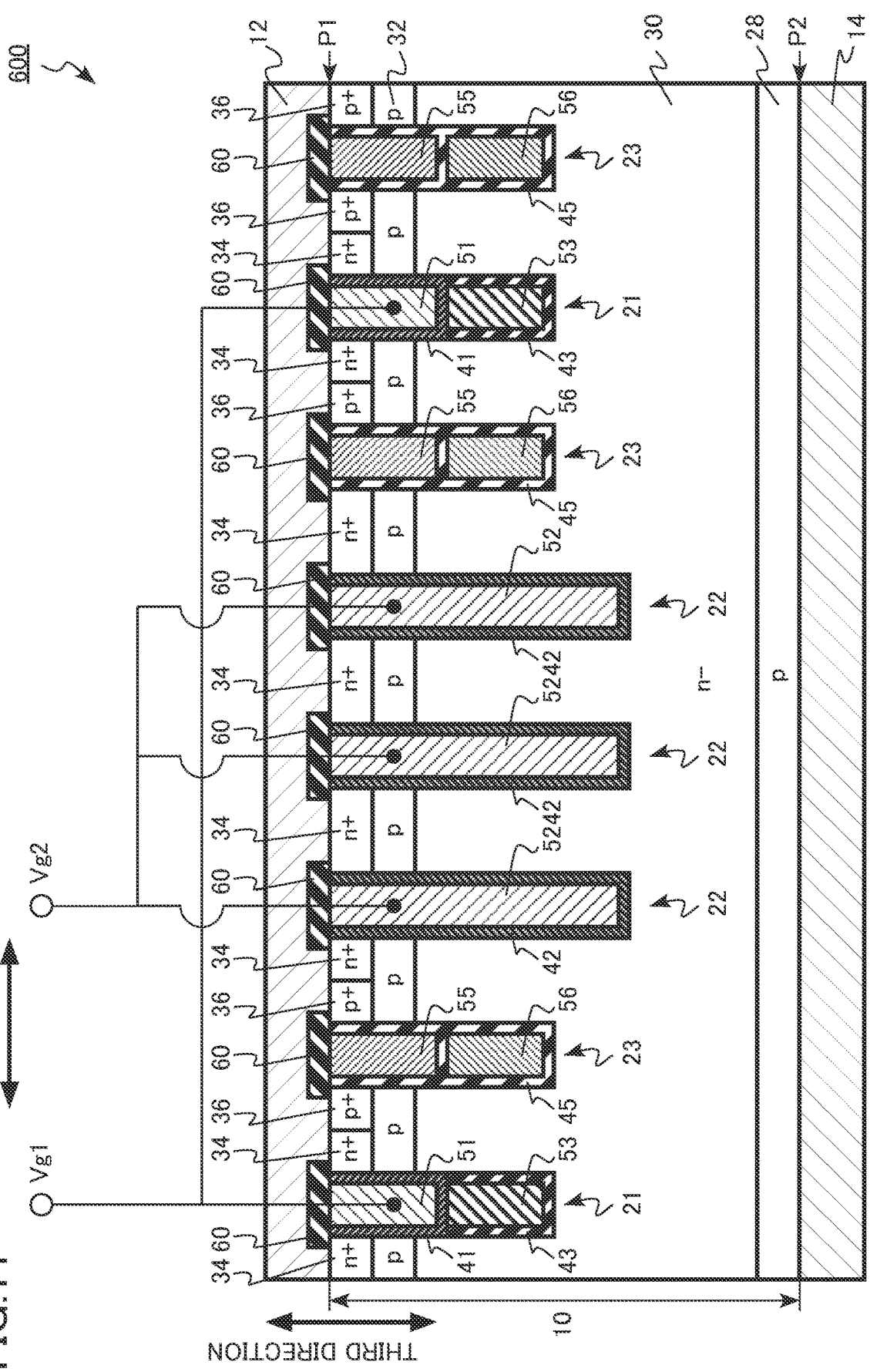
FIG. 11 is a schematic cross-sectional view of a semiconductor device according to a sixth embodiment.

FIG. 11 is a schematic cross-sectional view of the semiconductor device of the sixth embodiment.

The depth of the second gate trench 22 is deeper than the depth of the first gate trench 21. In addition, the depth of the second gate trench 22 is also deeper than the depth of the dummy trench 23.

Since the depth of the second gate trench 22 is deeper than the depth of the first gate trench 21 and the depth of the second gate trench 22 is deeper than the depth of the dummy trench 23, discharge of holes to the emitter electrode 12 is suppressed. This can increase the carrier concentration when the IGBT is in an on-state. Thus, the on-resistance of the IGBT 600 is reduced.

As described above, the IGBT of the sixth embodiment makes it possible to reduce the switching loss. Further, according to the IGBT of the sixth embodiment, the on-resistance is reduced.

Seventh Embodiment

A semiconductor device of a seventh embodiment differs from the semiconductor device of the first embodiment. The difference is that a third gate electrode pad having a third gate voltage applied is further provided on a side of the first face relative to the semiconductor layer and is electrically connected to the second conductive layer. Hereinafter, description of contents overlapping with the first embodiment may be partially omitted.

A semiconductor circuit in the seventh embodiment includes, as components, a semiconductor device and a control circuit configured to control the semiconductor device.

The semiconductor device of the seventh embodiment is a trench gate-type IGBT 700 including a gate electrode into a trench formed in a semiconductor layer. The IGBT 700 is an IGBT allowing for double gate driving. The following describes, as an example, the case where the first conductivity type is p-type and the second conductivity type is n-type.

The control circuit in the seventh embodiment is a gate driver circuit 250.

Figure 12:
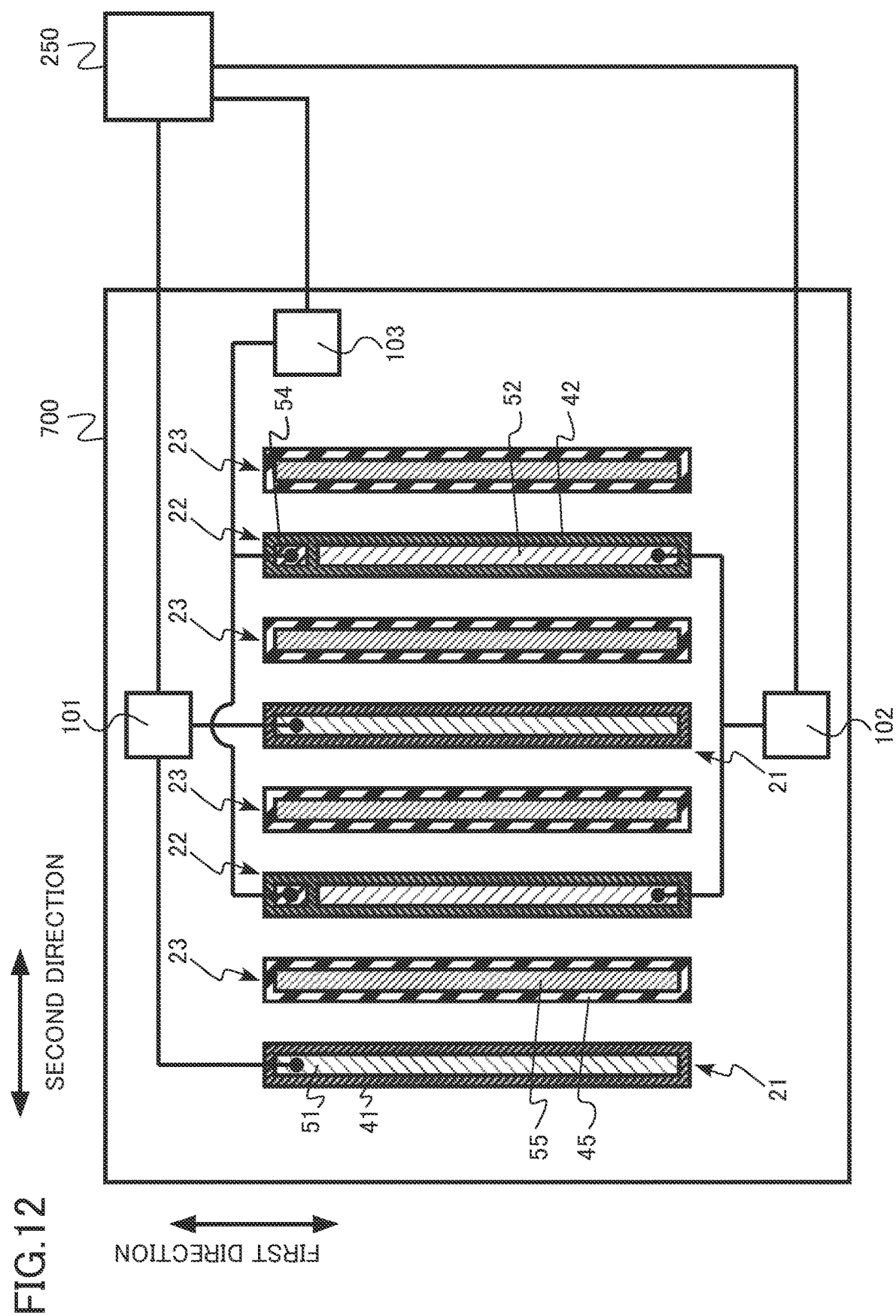
FIG. 12 is a schematic diagram of a semiconductor circuit in a seventh embodiment.
Figure 13:
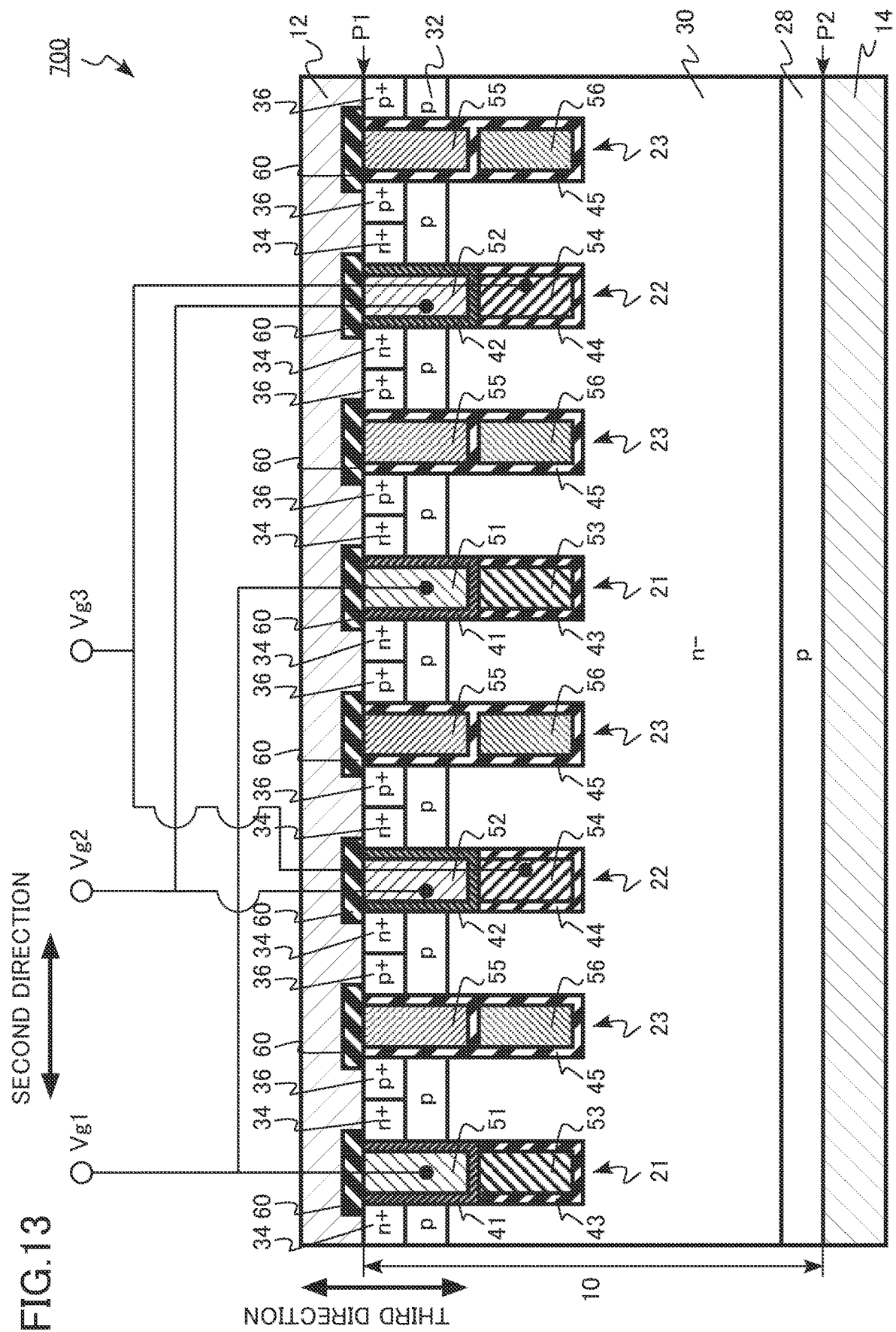
FIG. 13 is a schematic cross-sectional view of a semiconductor device of the seventh embodiment.

FIG. 12 is a schematic diagram of the semiconductor circuit in the seventh embodiment. FIG. 12 illustrates how to dispose and connect first trenches, second trenches, third trenches, first gate electrodes, second gate electrodes, second conductive layers, upper conductive layers, first gate insulating films, second gate insulating films, trench insulating films, a first gate electrode pad, a second gate electrode pad, a third gate electrode pad, and a control circuit. FIG. 13 is a schematic cross-sectional view of the semiconductor device of the seventh embodiment.

The IGBT 700 of the seventh embodiment includes a semiconductor layer 10, an emitter electrode 12 (first electrode), a collector electrode 14 (second electrode), a first gate insulating film 41, a second gate insulating film 42, a first insulating film 43, a second insulating film 44, a trench insulating film 45, a first gate electrode 51, a second gate electrode 52, a first conductive layer 53, a second conductive layer 54, an upper conductive layer 55, a lower conductive layer 56, an interlayer insulating layer 60, a first gate electrode pad 101, a second gate electrode pad 102, and a third gate electrode pad 103.

The semiconductor layer 10 provides a first gate trench 21 (first trench), a second gate trench 22 (second trench), a dummy trench 23 (third trench), a collector region 28 (first semiconductor region), a drift region 30 (second semiconductor region), a base region 32 (third semiconductor region), an emitter region 34 (fourth semiconductor region), and a contact region 36.

The second conductive layer 54 is electrically separated from the second gate electrode 52. The second conductive layer 54 is electrically connected to the third gate electrode pad 103.

The third gate electrode pad 103 is electrically connected to the second conductive layer 54. The third gate electrode pad 103 and the second conductive layer 54 are connected by, for example, metal wiring (not shown). A third gate voltage (Vg3) is applied to the third gate electrode pad 103. The third gate voltage (Vg3) is then applied to the second conductive layer 54.

The gate driver circuit 250 is provided, for example, in the same module as of the IGBT 700 or on the same circuit board as of the IGBT 700. The gate driver circuit 250 functions to drive the IGBT 700.

The gate driver circuit 250 functions to apply a desired first gate voltage (Vg1) to the first gate electrode pad 101 at a desired timing. The gate driver circuit 250 also functions to apply a desired second gate voltage (Vg2) to the second gate electrode pad 102 at a desired timing. The gate driver circuit 250 further functions to apply a desired third gate voltage (Vg3) to the third gate electrode pad 103 at a desired timing.

The gate driver circuit 250 changes the second gate voltage (Vg2) from the first voltage (V1) to the second voltage (V2) before the first gate voltage (Vg1) is switched from the turn-on voltage to the turn-off voltage. If the first conductivity type is p-type, the second voltage (V2) is a negative voltage, and if the first conductivity type is n-type, the second voltage is a positive voltage.

The gate driver circuit 250 controls the third gate voltage (Vg3) to a third voltage (V3) after the first gate voltage (Vg1) is switched from the turn-off voltage (Voff) to the turn-on voltage (Von). The absolute value of the third voltage (V3) is smaller than the absolute value of the first voltage (V1). The third voltage (V3) is, for example, the turn-off voltage (Voff).

The gate driver circuit 250 switches the first gate voltage (Vg1) from the turn-off voltage (Voff) to the turn-on voltage (Von), and then controls, after a predetermined time elapses, the third gate voltage (Vg3) to a fourth voltage (V4).

The fourth voltage (V4) is, for example, equal to the third voltage (V3). The fourth voltage (V4) is, for example, the turn-off voltage (Voff).

The absolute value of the fourth voltage (V4) is, for example, larger than the third voltage (V3). The fourth voltage (V4) is, for example, equal to the turn-on voltage (Von).

The fourth voltage (V4) is, for example, equal to the first voltage (V1). If the first conductivity type is p-type, the fourth voltage (V4) is 0 V (zero volts) or a positive voltage, and if the first conductivity type is n-type, the fourth voltage is 0 V (zero volts) or a negative voltage.

The gate driver circuit 250 changes the third gate voltage (Vg3) from the fourth voltage (V4) to a fifth voltage (V5) before the first gate voltage (Vg1) is switched from the turn-on voltage to the turn-off voltage. If the first conductivity type is p-type, the fifth voltage (V5) is a negative voltage, and if the first conductivity type is n-type, the fifth voltage is a positive voltage. The fifth voltage (V5) is, for example, equal to the second voltage (V2).

Next, a method of driving the IGBT 700 will be described.

Figure 14:
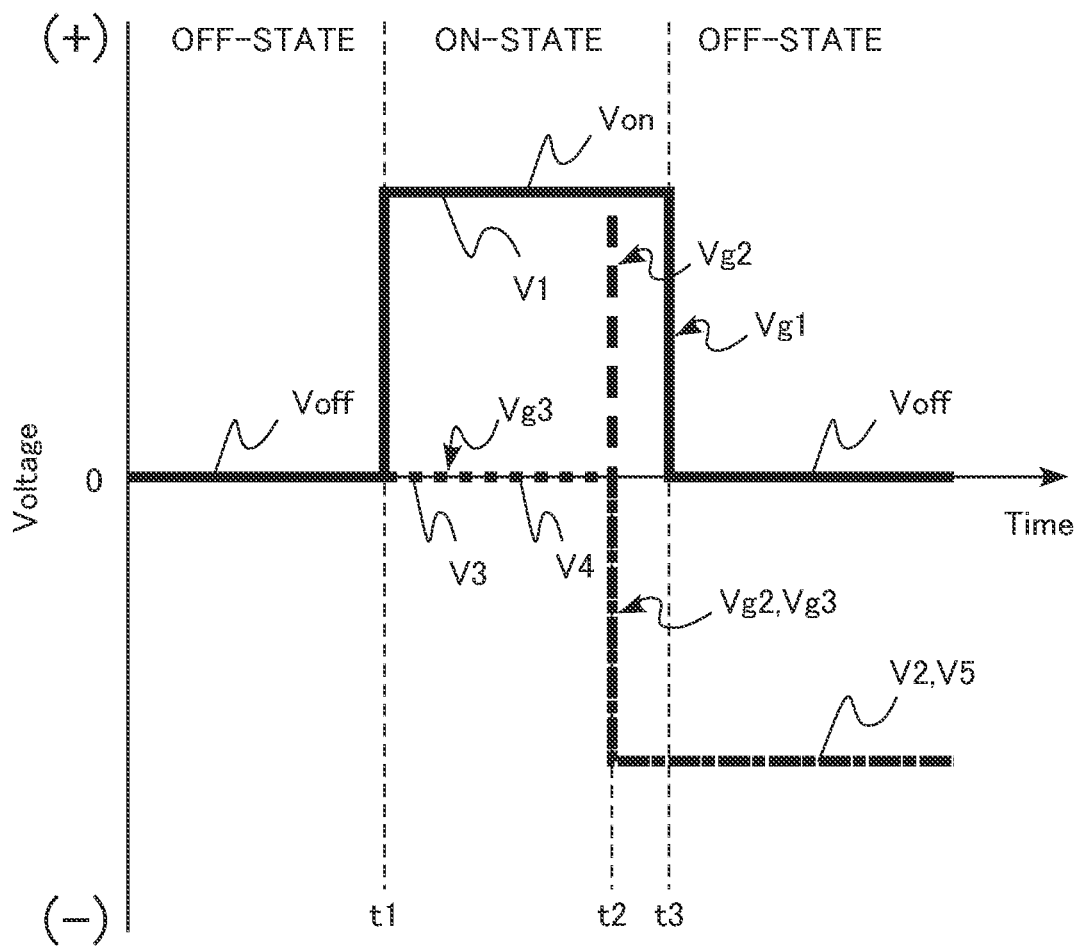
FIG. 14 is a chart illustrating a first method of driving the semiconductor device of the seventh embodiment.

FIG. 14 is a chart illustrating the first method of driving the semiconductor device of the seventh embodiment. FIG. 14 is a timing chart of the first gate voltage (Vg1) applied to the first gate electrode pad 101, the second gate voltage (Vg2) applied to the second gate electrode pad 102, and the third gate voltage (Vg3) applied to the third gate electrode pad 103.

The structure of a transistor having the first gate electrode 51 or the structure of a transistor having the second gate electrode 52 is not a clearly separated structure. However, for convenience of description of the operation, they are hereinafter expressed as a transistor having the first gate electrode 51 or a transistor having the second gate electrode 52.

If the IGBT 700 is in an off-state, for example, an emitter voltage is applied to the emitter electrode 12. The emitter voltage is, for example, 0 V. A collector voltage is applied to the collector electrode 14. The collector voltage is, for example, 200 V or more and 6500 V or less.

If the IGBT 700 is in an off-state, a turn-off voltage (Voff) is applied to the first gate electrode pad 101. Here, the first gate voltage (Vg1) is the turn-off voltage (Voff). Thus, the turn-off voltage (Voff) is also applied to the first gate electrode 51.

The turn-off voltage (Voff) is a voltage lower than a threshold voltage at which the transistor having the first gate electrode 51 is turned on, and is, for example, 0 V or a negative voltage.

If the state is off, no n-type inversion layer is formed in the base region 32 facing the first gate electrode 51 and in contact with the first gate insulating film 41.

If the IGBT 700 is in an off-state, a turn-off voltage (Voff) is applied to the second gate electrode pad 102. Here, the second gate voltage (Vg2) is the turn-off voltage (Voff). Thus, the turn-off voltage (Voff) is also applied to the second gate electrode 52.

The turn-off voltage (Voff) is a voltage lower than a threshold voltage at which the transistor having the second gate electrode 52 is turned on, and is, for example, 0 V or a negative voltage.

If the state is off, no n-type inversion layer is formed in the base region 32 facing the second gate electrode 52 and in contact with the second gate insulating film 42.

If the IGBT 700 is in an off-state, a turn-off voltage (Voff) is applied to the third gate electrode pad 103. Here, the third gate voltage (Vg3) is the turn-off voltage (Voff). Thus, the turn-off voltage (Voff) is also applied to the second conductive layer 54.

When the IGBT 700 is turned on (at time t1 in FIG. 14), a turn-on voltage (Von) is applied to the first gate electrode pad 101. Here, the first gate voltage (Vg1) is the turn-on voltage (Von). The turn-on voltage (Von) is also applied to the first gate electrode 51.

The turn-on voltage (Von) is a positive voltage exceeding the threshold voltage of the transistor having the first gate electrode 51. The turn-on voltage (Von) is, for example, 15 V. The turn-on voltage (Von) is applied to the first gate electrode 51 to turn on the transistor having the first gate electrode 51.

When the IGBT 700 is turned on (at time t1 in FIG. 14), the first voltage (V1) is also applied to the second gate electrode pad 102. Here, the second gate voltage (Vg2) is the first voltage (V1).

The first voltage (V1) is equal to the turn-on voltage (Von). The turn-on voltage (Von) is also applied to the second gate electrode 52. The turn-on voltage (Von) is applied to the second gate electrode 52 to turn on the transistor having the second gate electrode 52.

After the IGBT 700 is turned on (at/after time t1 in FIG. 14), the third voltage (V3) is applied to the third gate electrode pad 103. The first gate voltage (Vg1) is switched from the turn-off voltage (Voff) to the turn-on voltage (Von), and the third gate voltage (Vg3) is then controlled to the third voltage (V3). The third voltage (V3) is equal to the turn-off voltage (Voff).

After the IGBT 700 is turned on and a predetermined time then elapses, the fourth voltage (V4) is applied to the third gate electrode pad 103. The fourth voltage (V4) is equal to the third voltage (V3).

When the IGBT 700 is turned off (at time t3 in FIG. 14), a turn-off voltage (Voff) is applied to the first gate electrode pad 101. Here, the first gate voltage (Vg1) is the turn-off voltage (Voff).

Before the first gate voltage (Vg1) is switched from the turn-on voltage (Von) to the turn-off voltage (Voff), that is, prior to time t3, the second gate voltage (Vg2) is changed from the first voltage (V1) to the second voltage (V2). The voltage applied to the second gate electrode pad 102 is changed from the first voltage (V1) to the second voltage (V2) at time t2.

The second voltage (V2) is a negative voltage. The second voltage (V2) is, for example, −15 V or more and less than 0 V. When the second voltage (V2) is applied to the second gate electrode pad 102, the second voltage (V2) is then applied to the second gate electrode 52. In addition, the second voltage (V2) is applied to the second gate electrode 52 to form a p-type inversion layer in the drift region 30 in contact with the second gate insulating film 42.

Before the first gate voltage (Vg1) is switched from the turn-on voltage (Von) to the turn-off voltage (Voff), that is, prior to time t3, the third gate voltage (Vg3) is changed from the fourth voltage (V4) to the fifth voltage (V5). The voltage applied to the third gate electrode pad 103 is thus changed from the fourth voltage (V4) to the fifth voltage (V5) at time t2.

The fifth voltage (V5) is a negative voltage. The fifth voltage (V5) is, for example, −15 V or more and less than 0 V. When the fifth voltage (V5) is applied to the third gate electrode pad 103, the fifth voltage (V5) is applied to the second conductive layer 54.

The fifth voltage (V5) is, for example, equal to the second voltage (V2). In addition, the fifth voltage (V5) is applied to the second conductive layer 54 to form a p-type inversion layer in the drift region 30 in contact with the second insulating film 44.

Figure 15:
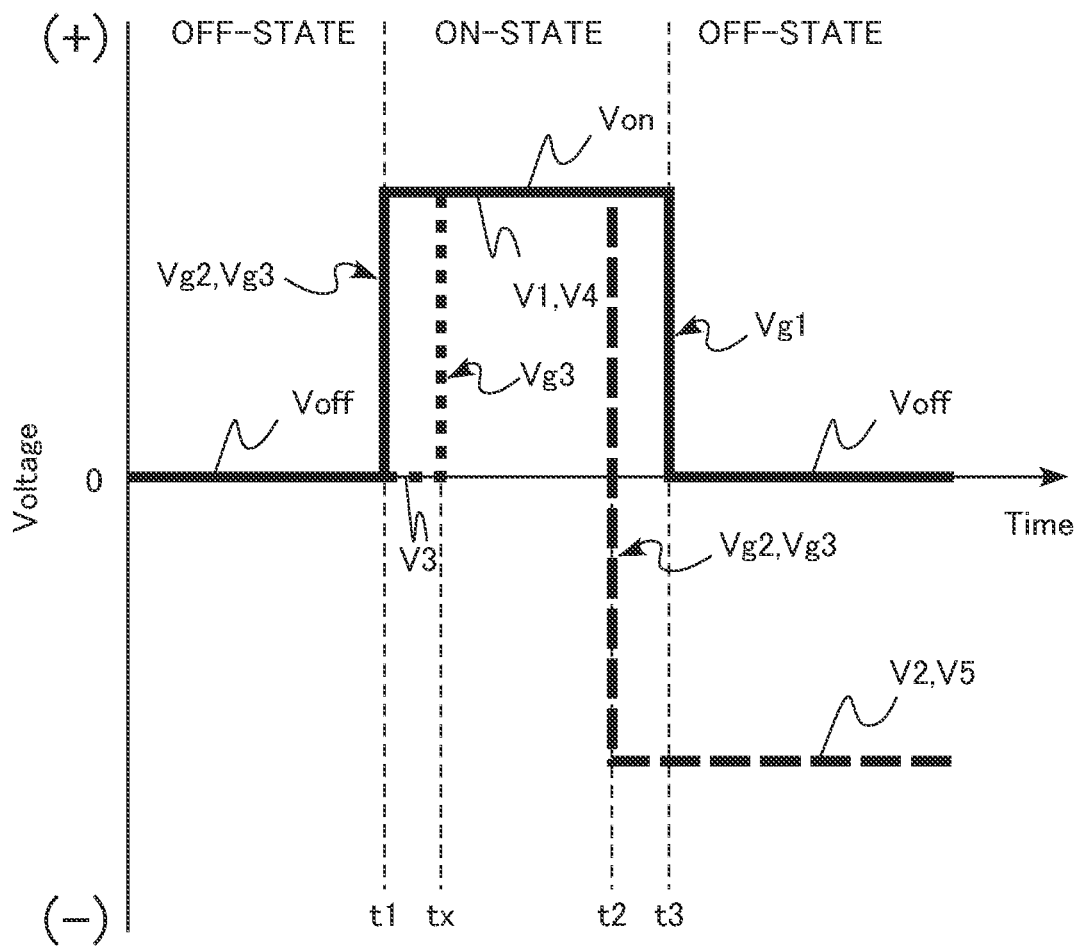
FIG. 15 is a chart illustrating a second method of driving the semiconductor device of the seventh embodiment.

FIG. 15 is a chart illustrating the second method of driving the semiconductor device of the seventh embodiment. FIG. 15 is a timing chart of the first gate voltage (Vg1) applied to the first gate electrode pad 101, the second gate voltage (Vg2) applied to the second gate electrode pad 102, and the third gate voltage (Vg3) applied to the third gate electrode pad 103.

In the second driving method, unlike the first driving method, the fourth voltage (V4) is equal to the turn-on voltage (Von).

After the IGBT 700 is turned on and a predetermined time then elapses (at tx in FIG. 15), the turn-on voltage (Von) as the fourth voltage (V4) is applied to the third gate electrode pad 103. After the IGBT 700 is turned on and a predetermined time then elapses (at tx in FIG. 15), the turn-on voltage (Von) is thus applied to the second conductive layer 54. The fourth voltage (V4) is equal to the first voltage (V1).

Next, functions and effects of the semiconductor device according to the seventh embodiment will be described.

In the IGBT 700 of the seventh embodiment, the first conductive layer 53 having a fixed emitter electric potential is provided under the first gate electrode 51. Like in the IGBT 100 of the first embodiment, this causes the turn-on loss of the IGBT 700 to decrease.

In the IGBT 700, the second gate voltage (Vg2) and the third gate voltage (Vg3) are set to a negative voltage before the first gate voltage (Vg1) is switched from the turn-on voltage (Von) to the turn-off voltage (Voff).

The second gate voltage (Vg2) and the third gate voltage (Vg3) are set to a negative voltage, so that a p-type inversion layer is formed in each of the drift region 30 in contact with the second gate insulating film 42 and the drift region 30 in contact with the second insulating film 44.

Accordingly, like in the IGBT 200 of the second embodiment, discharge of holes to the emitter electrode 12 during the turn-off operation is promoted. This makes it possible to further reduce the switching loss.

Furthermore, in the IGBT 700 of the seventh embodiment, the third gate voltage (Vg3) applied to the second conductive layer 54 during the turn-on operation is not changed. Accordingly, the turn-on loss is lower than, for example, that of the IGBT 200 of the second embodiment.

In addition, in the second driving method, after the IGBT 700 is turned on and a predetermined time then elapses, the turn-on voltage (Von) is applied to the second conductive layer 54. When the turn-on voltage (Von) is applied to the second conductive layer 54, an n-type accumulation layer is formed in the drift region 30 in contact with the second insulating film 44. The n-type accumulation layer is formed in the drift region 30 in contact with the second insulating film 44 so as to reduce the on-resistance of the IGBT 700.

Figure 16:
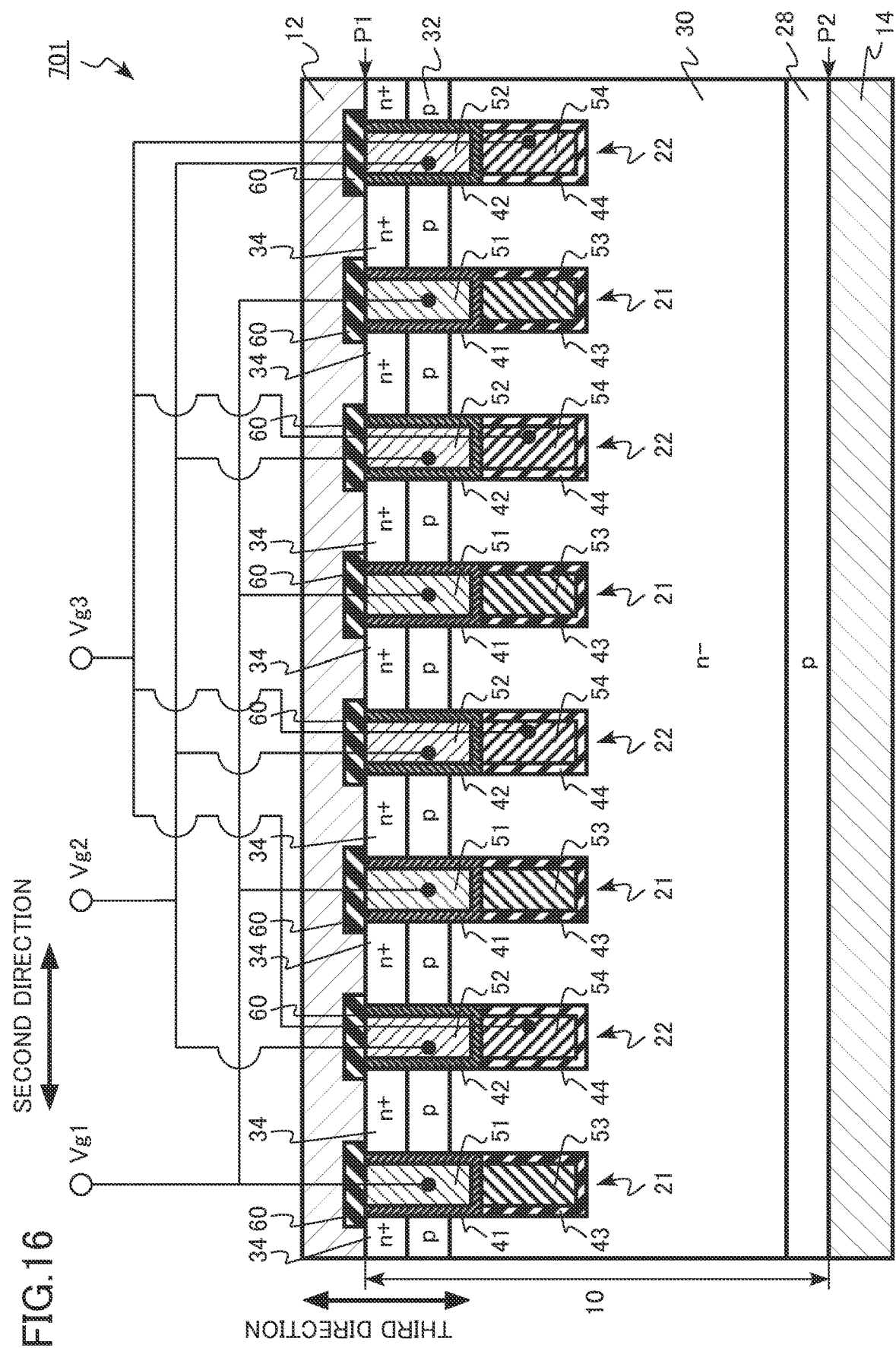
FIG. 16 is a schematic cross-sectional view of a modification embodiment of the semiconductor device of the seventh embodiment.

FIG. 16 is a schematic cross-sectional view of a modification embodiment of the semiconductor device of the seventh embodiment. An IGBT 701 of the modification embodiment differs from the IGBT 700 of the seventh embodiment. The difference is that no dummy trench 23 is provided in the semiconductor layer 10.

In FIG. 16, the contact region 36 is not depicted. The contact region 36 is provided, for example, in the first direction of the emitter region 34.

As described above, according to the IGBT of the seventh embodiment and the IGBT of the modification embodiment, the switching loss can be reduced. In addition, the semiconductor circuit including the IGBT of the seventh embodiment or the semiconductor circuit including the IGBT of the modification embodiment makes it possible to reduce the switching loss. Besides, the on-resistance of the IGBT is reduced.

Eighth Embodiment

A semiconductor device of an eighth embodiment differs from the semiconductor device of the seventh embodiment. The difference is that the first conductive layer in the semiconductor layer is electrically connected to the third gate electrode pad. Hereinafter, description of contents overlapping with the seventh embodiment may be partially omitted.

The semiconductor device of the eighth embodiment is a trench gate-type IGBT 800 including a gate electrode into a trench formed in a semiconductor layer.

Figure 17:
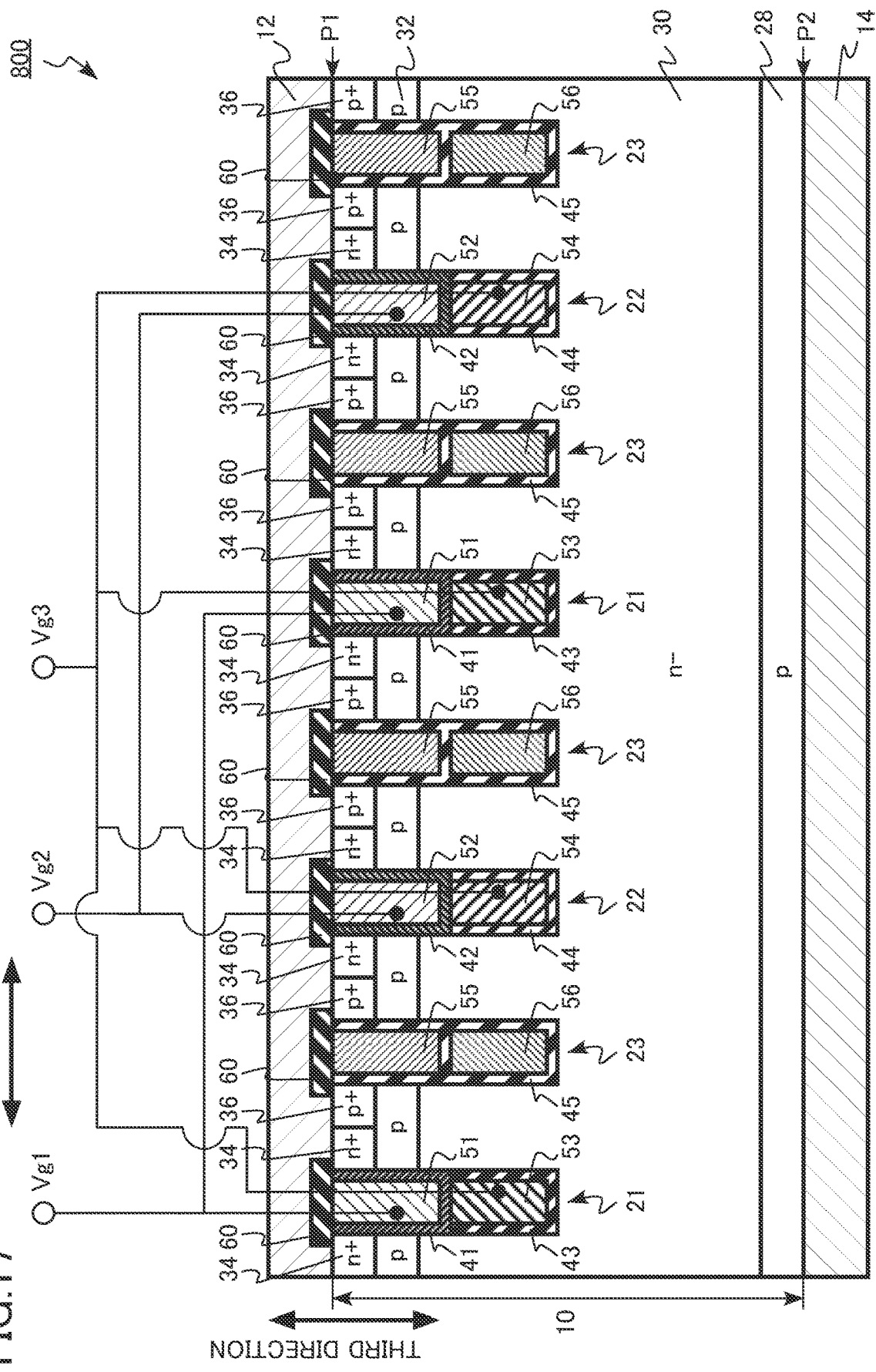
FIG. 17 is a schematic cross-sectional view of a semiconductor device according to an eighth embodiment.

FIG. 17 is a schematic cross-sectional view of the semiconductor device of the eighth embodiment.

The first conductive layer 53 of the IGBT 800 is electrically connected to the third gate electrode pad 103. The first conductive layer 53 is electrically connected to the second conductive layer 54.

A third gate voltage (Vg3) is applied to the third gate electrode pad 103. The third gate voltage (Vg3) is applied to the first conductive layer 53.

The IGBT 800 operates using, for example, the second driving method in the seventh embodiment.

In the second driving method, after the IGBT 800 is turned on and a predetermined time then elapses, a turn-on voltage (Von) is applied to the first conductive layer 53. When the turn-on voltage (Von) is applied to the first conductive layer 53, an n-type accumulation layer is formed in the drift region 30 in contact with the first insulating film 43. The n-type accumulation layer is formed in the drift region 30 in contact with the first insulating film 43 so as to reduce the on-resistance of the IGBT 700.

As described above, the IGBT of the eighth embodiment makes it possible to reduce the switching loss. Besides, the on-resistance of the IGBT is reduced.

Ninth Embodiment

A semiconductor device of a ninth embodiment differs from the semiconductor device of the seventh embodiment. The difference is that a plurality of the third trenches are provided between the first trench and the second trench. Hereinafter, description of contents overlapping with the seventh embodiment may be partially omitted.

The semiconductor device of the ninth embodiment is a trench gate-type IGBT 900 including a gate electrode into a trench formed in a semiconductor layer.

Figure 18:
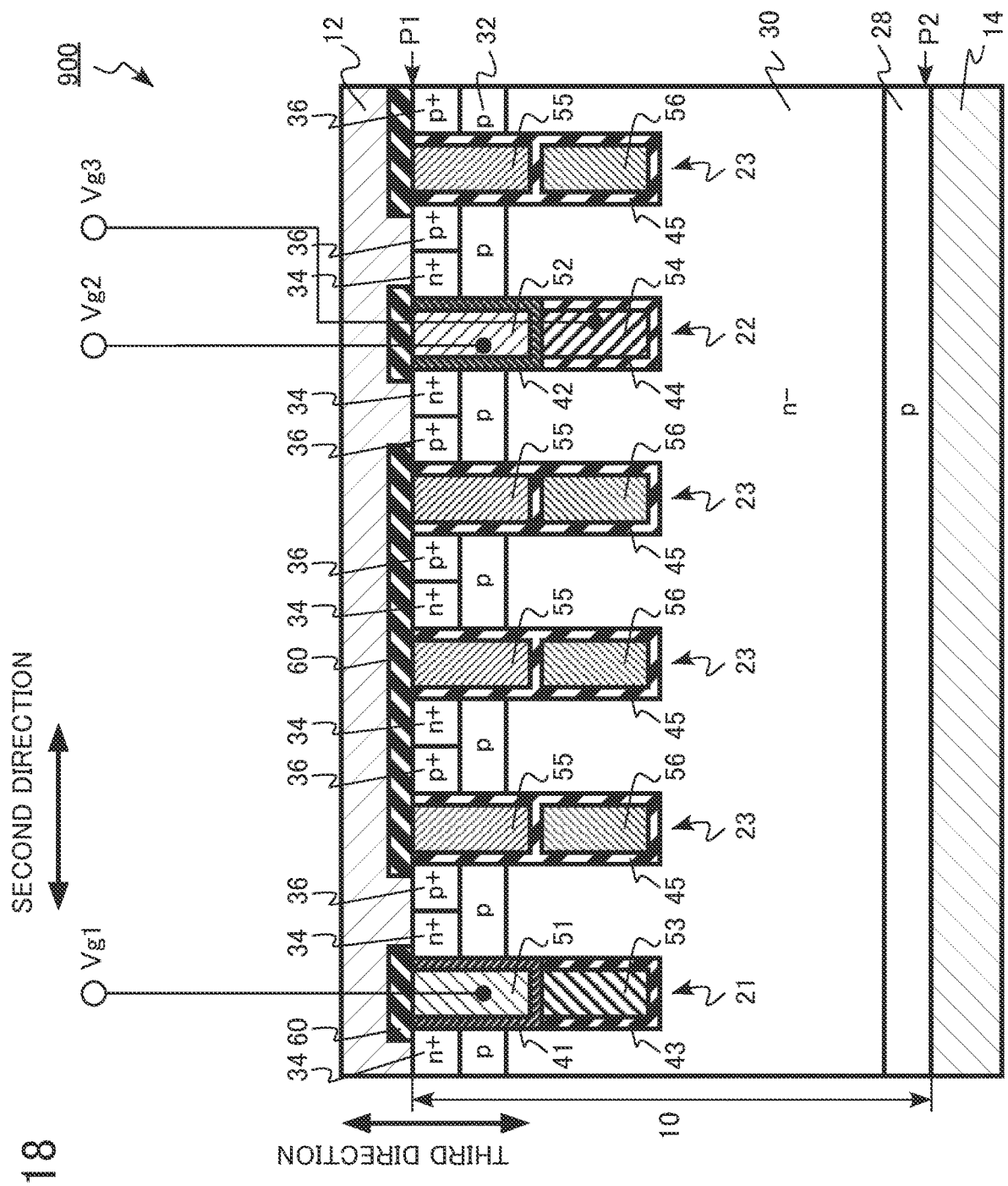
FIG. 18 is a schematic cross-sectional view of a semiconductor device according to a ninth embodiment.

FIG. 18 is a schematic cross-sectional view of the semiconductor device of the ninth embodiment.

In the IGBT 900, three dummy trenches 23 are provided between the first gate trench 21 and the second gate trench 22.

An upper portion of a mesa region between the dummy trenches 23 has a smaller area in contact with the emitter electrode 12 than an upper portion of a mesa region between the first gate trench 21 and the dummy trench 23 or an upper portion of a mesa region between the second gate trench 22 and the dummy trench 23. As a result, discharge of holes to the emitter electrode 12 is suppressed. This can increase the carrier concentration when the IGBT is in an on-state. Thus, the on-resistance of the IGBT 900 is reduced.

As described above, the IGBT of the ninth embodiment makes it possible to reduce the switching loss. Further, according to the IGBT of the ninth embodiment, the on-resistance is reduced.

Tenth Embodiment

A semiconductor device of a tenth embodiment differs from the semiconductor device of the ninth embodiment. The difference is that the upper conductive layer 55 and the lower conductive layer 56 in the third trench are connected to the third gate electrode pad. Hereinafter, description of contents overlapping with the ninth embodiment may be partially omitted.

The semiconductor device of the tenth embodiment is a trench gate-type IGBT 1000 including a gate electrode into a trench formed in a semiconductor layer.

Figure 19:
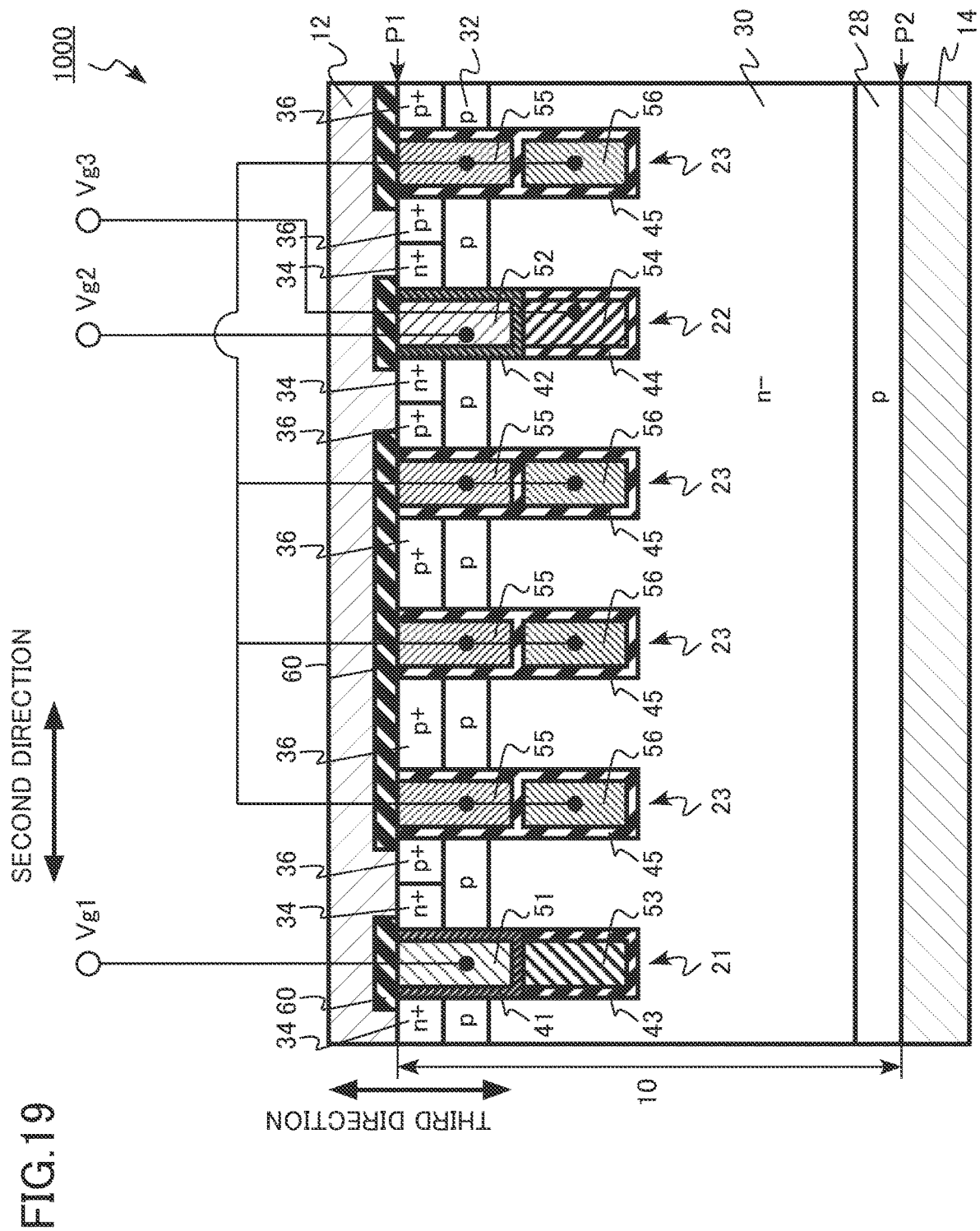
FIG. 19 is a schematic cross-sectional view of a semiconductor device according to a tenth embodiment.

FIG. 19 is a schematic cross-sectional view of the semiconductor device of the tenth embodiment.

In the IGBT 1000, three dummy trenches 23 are provided between the first gate trench 21 and the second gate trench 22.

The upper conductive layer 55 is electrically connected to the third gate electrode pad 103. The upper conductive layer 55 is also electrically connected to the second conductive layer 54.

The lower conductive layer 56 is electrically connected to the third gate electrode pad 103. The lower conductive layer 56 is also electrically connected to the second conductive layer 54.

The trench insulating film 45 is provided between the upper conductive layer 55 and the semiconductor layer 10. The trench insulating film 45 is also provided between the lower conductive layer 56 and the semiconductor layer 10. The trench insulating film 45 is spaced from the emitter region 34.

A third gate voltage (Vg3) is applied to the third gate electrode pad 103. The third gate voltage (Vg3) is thus applied to the upper conductive layer 55 and the lower conductive layer 56.

An upper portion of a mesa region between the dummy trenches 23 has a smaller area in contact with the emitter electrode 12 than an upper portion of a mesa region between the first gate trench 21 and the dummy trench 23 or an upper portion of a mesa region between the second gate trench 22 and the dummy trench 23. As a result, discharge of holes to the emitter electrode 12 is suppressed. This can increase the carrier concentration when the IGBT is in an on-state. Thus, the on-resistance of the IGBT 1000 is reduced.

The IGBT 1000 operates using, for example, the second driving method in the seventh embodiment.

In the second driving method, after the IGBT 1000 is turned on and a predetermined time then elapses, a turn-on voltage (Von) is applied to the upper conductive layer 55 and the lower conductive layer 56. When the turn-on voltage (Von) is applied to the upper conductive layer 55 and the lower conductive layer 56, an n-type accumulation layer is formed in the drift region 30 in contact with the trench insulating film 45. The n-type accumulation layer is formed in the drift region 30 in contact with the trench insulating film 45 so as to reduce the on-resistance of the IGBT 1000.

As described above, the IGBT of the tenth embodiment makes it possible to reduce the switching loss. Further, according to the IGBT of the tenth embodiment, the on-resistance is reduced.

In the first to tenth embodiments, the case where the semiconductor layer is made of monocrystalline silicon has been described as an example. However, the semiconductor layer is not limited to monocrystalline silicon. For example, other monocrystalline semiconductors such as monocrystalline silicon carbide may be used.

In the first to tenth embodiments, the case where the trenches are disposed in parallel and shaped like a stripe has been described as an example. The present disclosure is also applicable to a mesh-shaped trench, where trenches intersect, or a dot-shaped trench.

In the first to tenth embodiments, the case where the first conductivity type is p-type and the second conductivity type is n-type has been described as an example. However, the first conductivity type and the second conductivity type may be n-type and p-type, respectively. If the first conductivity type is n-type and the second conductivity type is p-type, for example, the second voltage (V2) is a positive voltage.

The disposition and ratio among the first gate trench 21, the second gate trench 22, and the dummy trench 23 are not limited to those in the first to tenth embodiments.

While certain embodiments have been described, these embodiments have been presented by way of example only, and are not intended to limit the scope of the inventions. Indeed, the semiconductor device and the semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer having a first face and a second face facing the first face,
the semiconductor layer including
a first semiconductor region of a first conductivity type,
a second semiconductor region of a second conductivity type, the second semiconductor region provided between the first semiconductor region and the first face,
a third semiconductor region of the first conductivity type, the third semiconductor region provided between the second semiconductor region and the first face,
a fourth semiconductor region of the second conductivity type, the fourth semiconductor region provided between the third semiconductor region and the first face,
a first trench provided in a first face side, and
a second trench provided in the first face side;
a first gate electrode provided in the first trench;

a first gate insulating film provided between the first gate electrode and the second semiconductor region, between the first gate electrode and the third semiconductor region, and between the first gate electrode and the fourth semiconductor region, the first gate insulating film being in contact with the fourth semiconductor region;

a first conductive layer provided in the first trench and between the first gate electrode and the second face, the first conductive layer being electrically separated from the first gate electrode;

a first insulating film provided between the first conductive layer and the second semiconductor region;

a second gate electrode provided in the second trench;

a second gate insulating film provided between the second gate electrode and the second semiconductor region and between the second gate electrode and the third semiconductor region;

a second conductive layer provided in the second trench and between the second gate electrode and the second face;

a second insulating film provided between the second conductive layer and the second semiconductor region;

a first electrode provided on the first face side of the semiconductor layer, the first electrode being electrically connected to the fourth semiconductor region;

a second electrode provided on a second face side of the semiconductor layer, the second electrode being electrically connected to the first semiconductor region;

a first gate electrode pad provided on the first face side of the semiconductor layer, the first gate electrode pad being electrically connected to the first gate electrode and having a first gate voltage applied; and a second gate electrode pad provided on the first face side of the semiconductor layer, the second gate electrode pad being electrically connected to the second gate electrode and having a second gate voltage applied.

2. The semiconductor device according to claim 1, wherein the second gate insulating film is in contact with the fourth semiconductor region.

3. The semiconductor device according to claim 1, wherein the second gate insulating film is spaced from the fourth semiconductor region.

4. The semiconductor device according to claim 1, wherein the first conductive layer is electrically connected to the first electrode.

5. The semiconductor device according to claim 1, wherein the second conductive layer is electrically connected to the first electrode.

6. The semiconductor device according to claim 1, wherein the second conductive layer is electrically connected to the second gate electrode pad.

7. The semiconductor device according to claim 1, further comprising a third gate electrode pad provided on the first face side of the semiconductor layer, the third gate electrode pad being electrically connected to the second conductive layer and having a third gate voltage applied.

8. The semiconductor device according to claim 2, further comprising a third gate electrode pad provided on the first face side of the semiconductor layer, the third gate electrode pad being electrically connected to the second conductive layer and having a third gate voltage applied.

9. The semiconductor device according to claim 8, wherein the first conductive layer in the semiconductor layer is electrically connected to the third gate electrode pad.

10. A semiconductor device comprising:
a semiconductor layer having a first face and a second face facing the first face,
the semiconductor layer including
a first semiconductor region of a first conductivity type,
a second semiconductor region of a second conductivity type, the second semiconductor region provided between the first semiconductor region and the first face,
a third semiconductor region of the first conductivity type, the third semiconductor region provided between the second semiconductor region and the first face,
a fourth semiconductor region of the second conductivity type, the fourth semiconductor region provided between the third semiconductor region and the first face,
a first trench provided in a first face side, and
a second trench provided in the first face side;
a first gate electrode provided in the first trench;
a first gate insulating film provided between the first gate electrode and the second semiconductor region, between the first gate electrode and the third semiconductor region, and between the first gate electrode and the fourth semiconductor region, the first gate insulating film being in contact with the fourth semiconductor region;
a first conductive layer provided in the first trench and between the first gate electrode and the second face, the first conductive layer being electrically separated from the first gate electrode;
a first insulating film provided between the first conductive layer and the second semiconductor region;
a second gate electrode provided in the second trench;
a second gate insulating film provided between the second gate electrode and the second semiconductor region, between the second gate electrode and the third semiconductor region, and between the second gate electrode and the fourth semiconductor region, the second gate insulating film being in contact with the fourth semiconductor region;
a first electrode provided on the first face side of the semiconductor layer, the first electrode being electrically connected to the fourth semiconductor region and the first conductive layer;
a second electrode provided on a second face side of the semiconductor layer, the second electrode being electrically connected to the first semiconductor region;
a first gate electrode pad provided on the first face side of the semiconductor layer, the first gate electrode pad being electrically connected to the first gate electrode and having a first gate voltage applied; and
a second gate electrode pad provided on the first face side of the semiconductor layer, the second gate electrode pad being electrically connected to the second gate electrode and having a second gate voltage applied.

11. A semiconductor circuit comprising:
the semiconductor device according to claim 1; and
a control circuit driving the semiconductor device, the control circuit configured to change the second gate voltage from a first voltage to a second voltage before the first gate voltage is switched from a turn-on voltage to a turn-off voltage,
wherein if the first conductivity type is p-type, the second voltage is a negative voltage and if the first conductivity type is n-type, the second voltage is a positive voltage.

12. A semiconductor circuit comprising:
the semiconductor device according to claim 9; and
a control circuit driving the semiconductor device, the control circuit configured to change the second gate voltage from a first voltage to a second voltage before the first gate voltage is switched from a turn-on voltage to a turn-off voltage,
wherein if the first conductivity type is p-type, the second voltage is a negative voltage and if the first conductivity type is n-type, the second voltage is a positive voltage.

* * * * *